United States Patent

Oshida et al.

[11] Patent Number: 5,684,565
[45] Date of Patent: Nov. 4, 1997

[54] PATTERN DETECTING METHOD, PATTERN DETECTING APPARATUS, PROJECTION EXPOSING APPARATUS USING THE SAME AND EXPOSURE SYSTEM

[75] Inventors: Yoshitada Oshida, Fujisawa; Hisafumi Iwata, Yokohama; Yasuhiro Yoshitake, Yokosuka; Minoru Yoshida; Yukihiro Shibata, both of Yokohama, all of Japan

[73] Assignee: Hitachi, Ltd., Tokyo, Japan

[21] Appl. No.: 304,586

[22] Filed: Sep. 12, 1994

[30] Foreign Application Priority Data

Sep. 10, 1993 [JP] Japan ................. 5-225432

[51] Int. Cl.⁶ .................. G03B 27/42; G03B 27/72
[52] U.S. Cl. .................. 355/53; 250/548; 356/400; 356/401; 355/71
[58] Field of Search .................. 250/548; 356/400, 356/401; 355/53, 67, 71

[56] References Cited

U.S. PATENT DOCUMENTS 4,777,374 10/1988 Nakata et al. .................. 250/548
5,266,790 11/1993 Markle et al. .................. 250/201.2
5,340,992 8/1994 Matsugu et al. .................. 250/548
5,432,607 7/1995 Taubenblatt .................. 356/364
5,477,309 12/1995 Ota et al. .................. 355/67
5,483,348 1/1996 Komatsu et al. .................. 356/401
5,489,986 2/1996 Magome et al. .................. 356/401

*Primary Examiner*—Arthur T. Grimley
*Assistant Examiner*—Herbert Kerner
*Attorney, Agent, or Firm*—Antonelli, Terry, Stout & Kraus, LLP.

[57] ABSTRACT

A method and apparatus is disclosed for detecting a pattern image of each of a plurality of patterns on the surface of an object. Light emitted from either a light source including a wide wavelength or a light source including a plurality of monowavelengths is applied to the object. The object includes a layered structure having a plurality of layers, wherein at least a part of an uppermost layer of the object is optically transparent. Spectral illumination intensity characteristics of the light emitted from the light source is varied, depending on information about both the layered structure of the object, and a material of the object to obtain a desired spectral illumination intensity, and a pattern image of each of patterns is detected as either a one-dimensional or a two-dimensional image based on light reflected from the object.

33 Claims, 20 Drawing Sheets $$I(\lambda) = \frac{Ii(\lambda)}{Iill(\lambda)Io.s(\lambda)}$$

$$I(x) = \sum_{i=1}^{n} I\lambda_i(x)\alpha(\lambda_i)$$

FIG. 18(A)
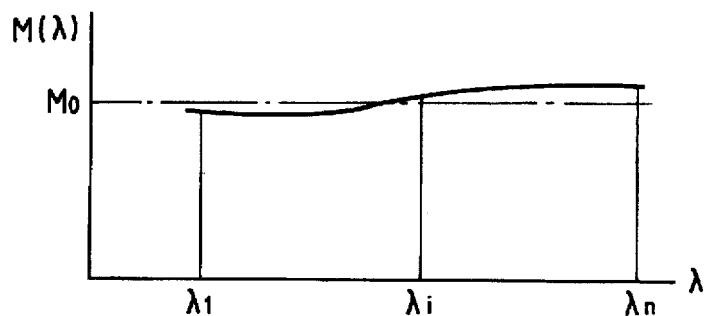
FIG. 18(B)
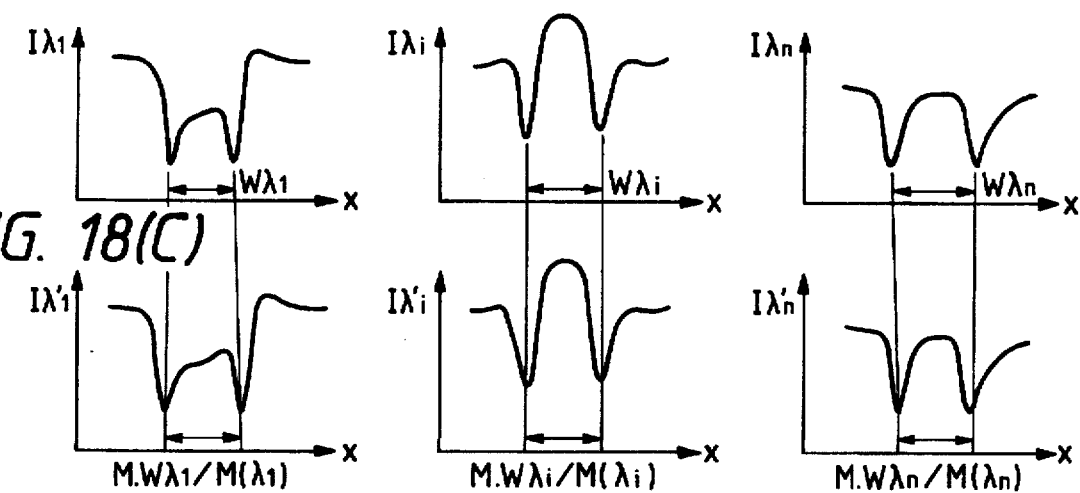
FIG. 18(C)
FIG. 18(D)
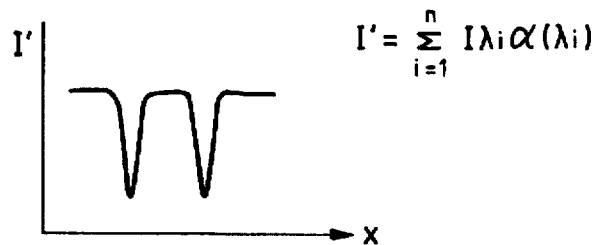
$$I' = \sum_{i=1}^{n} I\lambda_i \alpha(\lambda_i)$$

PATTERN DETECTING METHOD, PATTERN DETECTING APPARATUS, PROJECTION EXPOSING APPARATUS USING THE SAME AND EXPOSURE SYSTEM

BACKGROUND OF THE INVENTION

The present invention relates to a method of and apparatus for detecting each of a plurality of patterns formed on an object which is comprised of a layered structure having a plurality of layers such as a semiconductor integrated circuit. More particularly, the present invention relates to a method of and apparatus for accurately detecting information about the position or the like of each of a plurality of patterns covered by an optically transparent layer such as a photoresist, and to a projection exposing device and an exposing system both using the method and the device.

There has been a demand for setting the width of a circuit pattern conductor or line to 0.5 µm or less and far setting an alignment precision to 0.1 µm or less under a circuit pattern exposure step with the advance of high integration and minimization of semiconductor integrated circuits. Thus, increasingly high precision alignment is required. Even when one attempts to evaluate the results of an alignment process and a superposition exposure process, the ability or capacity of detection even at the above-described settings higher accuracy is required.

The worst barrier to the realization of detection with high accuracy is attributable to a pattern used for exposure and detection, or is that a photoresist applied onto the pattern thinly (in a thickness of 1 µm to 2 µm) is not symmetrically formed. When the thickness of an optically transparent film formed on the uppermost layer of the pattern becomes unsymmetrical, as seen in a cross section depending on the location, a detected waveform becomes unsymmetrical as shown in FIG. 13 after the pattern has been detected with light of a monowavelength. When it is desired to detect the position of the center of a pattern, for example, the detected center is substantially shifted or displaced from the true center thereof.

In order to cope with the above problem, a method has been proposed for dividing a detected wavelength into a number of wavelengths or making a bandwidth of the wavelength wider to thereby detect a waveform, as disclosed in Japanese Patent Laid-Open Nos. 61-203640 and 1-227431. By of using such a method, higher detection precision can be obtained as compared with the case where each pattern is detected with the light of the monowavelength.

Thus, the conventional method referred to above encounters difficulties in ensuring the accuracy of such an extent that it can cope with the future minimization of the pattern. This is because any object to be detected cannot be detected with higher accuracy because the detected wavelength is fixed in the above method. In other words, intensity distributions (spectral illumination intensity characteristics of light) of detected wavelengths highest in detection accuracy vary or differ depending on a layer structure of an object to be detected. The conventional prior art simply amounted or was limited to the fact that the intensity distribution of each detected wavelength was fixed to any extent, or any one or all of a plurality of detected light beams prepared in advance were used. Such a choice was carried out by evaluating the accuracy of alignment after the result of detection of an object by each light or after an exposure process has been made. Therefore, the integrated circuit having the pattern line whose width is 0.5 µm or less, not only does not obtain sufficient accuracy but requires a lot of time upon selecting one of the wavelengths.

This point will be described in further detail. For ease of understanding a simple structure is illustrated in FIG. 13. It is assumed that reflectance or reflectance ratio of an undercoat varies depending on the wavelength as shown in FIG. 14A. This example normally takes place in the case of an object to be detected, which is comprised of a multilayer structure. Even when the undercoat is not shaped in the form of the layer structure, an object to be detected, of such a type that the wavelength greatly depends on spectral reflectance characteristics of a material of the undercoat also corresponds to this example. When white light having a spectral illuminance distribution shown in FIG. 14B is used to detect an object having a layer structure, it is well known that it is hard to be affected by a film thickness. However, when the reflection ratio of the undercoat varies depending on the wavelength as shown in FIG. 14A, this makes a poor contribution to a detected waveform of a wavelength low in reflection ratio. Thus, such a result is substantially equivalent to the fact that the waveform has been detected at a narrow wavelength as illustrated in FIG. 14C. Consequently, a greater influence is produced depending on the film thickness of the object and the detected waveform is brought to one that is unsymmetrical and has strong distortion as shown in FIG. 14D.

Further, the conventional detecting method makes use of a predetermined numerical aperture for a detection optical system regardless of each wavelength employed for detection. However, if attention is given to the fact that the synthesis or combination of detected waveforms obtained at respective wavelengths corresponds to a finally obtainable waveform, the resolution L of a detected image is given by the following equation:

$$L = 0.6 \times \lambda / NA \quad (1)$$

Thus, the resolution varies depending on each wavelength. As a result, the resolution varies so as to be proportional to each wavelength and the synthesis of the waveforms at the respective wavelengths different in resolution from each other is detected, so that the effect of synthesizing the wavelengths or waveforms is reduced.

Further, when it is desired to detect a waveform at a wavelength wide in bandwidth as in the prior art, it is affected by a chromatic aberration, particularly a transverse chromatic aberration included in a detection optical system. When it is desired to detect an edge of a pattern, for example, the position of its edge varies for each wavelength, thereby causing errors in alignment, dimension and position detections. In the case of a detection precision of 0.1 µm or so, such errors offer no problem. However, in a future measuring technique which requires a precision of 0.05 µm or less, a greater problem is encountered. It is, however, very difficult to fabricate a detection optical system, i.e., a microscopic objective lens and a reduction lens, which meet the accuracy referred to above.

SUMMARY OF THE INVENTION

In order to solve the above problems, the present invention uses either a light source including a wide wavelength or a light source effectively including a plurality of monowavelengths. Light emitted from the light source is applied to an object to be detected, which is comprised of a layer structure and has at least a part of an uppermost layer of a surface thereof being optically transparent. Each of the patterns on the surface of the object is detected using the light reflected from the object. At this time, spectral illumination intensity characteristics (or wavelength intensity distribution characteristics) of the light emitted from the light source are effectively varied depending on information about both the layer structure and a material of the object to thereby obtain a desired spectral illumination intensity. Next, a pattern image of the object irradiated with the light at the desired spectral illumination intensity is detected as either a one-dimensional or a two-dimensional image.

As a further specific apparatus for effecting the aforementioned detecting method, the following is known as one example. That is, the light emitted from the light source is set in such a manner that the traveling direction of the light is varied for each wavelength by a light separating apparatus. Thereafter, a spatial light transmittance modulator for making light transmittances different from each other at each location where the light of each wavelength passes therethrough may be inserted into optical paths separated by the light separating apparatus so as to effectively vary the spectral illumination intensity characteristics (or wavelength intensity distribution characteristics).

As another specific example, the following is known. That is, when the pattern image of the object irradiated with the light is detected as either the one-dimensional or the two-dimensional image, a spectral transmittance variable filter for varying a transmittance for each wavelength of the light reflected from the object is inserted into each optical path of the light reflected from the object to thereby vary the spectral transmittance of each detected light. It is thus decided that the illumination has been made at the optimum spectral intensity. Therefore, the spectral illumination intensity characteristics (or wavelength intensity distribution characteristics) of the light emitted from the light source are effectively varied.

In order to solve the problem that the resolution capabilities differ from each other at every wavelength, which is confronting the prior art, the present invention further provides the following method. That is, when the pattern image of the object irradiated with the light at the desired spectral illumination intensity is detected as either the one-dimensional or the two-dimensional image, the numerical apertures (NA) used for pattern detection are made different from each other at every wavelength of the light reflected from the object.

Further, in this case, each wavelength of the illuminating light is caused to have directivity so as to reach a partial coherence of illumination having a predetermined ratio with respect to each of the numerical apertures.

In order to solve the problem about the chromatic aberration, the present invention provides the following method. That is, light emitted from either a light source including a wide wavelength or a light source effectively including a plurality of monowavelengths is applied to an object to be detected. Each of patterns on the surface of the object is detected using the light reflected from the object. At this time, the light emitted from the light source and reflected from the object is substantially focused on a light separating apparatus such as a diffraction grating. Each of the patterns existing on the light separating apparatus is focused so as to be formed as an image in a pattern detecting direction orthogonal to each of directions in which the patterns separated by the light separating apparatus are spectrally separated. Further, the patterns are detected by a two-dimensional image sensing apparatus as spectral one-dimensional images in a state in which the object subjected to the spectral process has been non-imaged with respect to the light separating direction. Moreover, a correction about a chromatic aberration included in a detection optical system is effected by signal processing on respective signals in the pattern detecting direction, which correspond to respective spectral wavelengths of the spectral one-dimensional images. Thereafter, the respective signals subjected to the chromatic aberration correction are combined into one, thereby detecting each pattern based on the combined signal.

The method of detecting the spectral one-dimensional images can bring about the same advantageous effect as that obtained when the respective signals existing in the pattern detecting direction, which correspond to the respective spectral wavelengths, are multiplied by constants different from each other every wavelength over the entirety of the signals. The corresponding respective wavelengths and the wavelengths of the signals are thereafter combined into one, thereby permitting detection of each pattern based on the combined wavelength. Then a pattern image of an object irradiated with light at a desired spectral illumination intensity can be detected by varying the spectral characteristics of the illuminating light.

Further, the use of the method of detecting the spectral one-dimensional images permits the following result. That is, if the above respective signals are multiplied every wavelengths by constants different from each other depending on locations of the signals having their corresponding wavelengths and the respective wavelengths of the signals are combined into one, thereby detecting each pattern based on the combined wavelength, then the optimum spectral illumination intensity is given and detected for each location depending upon a layer structure and a material which vary or differ for each location.

In order to set the above spectral illumination intensity to a desired intensity, i.e., the optimum intensity, the present invention provides the following method. That is, a multiple interference intensity at each wavelength of the detected light, which is caused by the layer structure, is calculated based on the information about both the layer structure and the material of the object. Further, the spectral illumination intensity characteristics (or wavelength intensity distribution characteristics) of the light emitted from the light source are effectively varied depending on the information so as to produce a waveform of each detected signal capable of reflecting the structure of each pattern with fidelity.

Each pattern detecting apparatus described above is effective not only for either a simple pattern detection or a pattern position detecting device but for an alignment pattern detection system necessary for alignment of a projection exposing device.

By constructing an exposing system in such a manner that the position of an alignment pattern formed under a resist applied on a wafer, or an alignment pattern formed after the wafer has been exposed to light, or an alignment pattern formed after development and etching is accurately measured by the above pattern detecting apparatus, and the result of measurement is fed backward or forward to a resist applying device, an exposing device, a developer unit or an etching device, superposition exposure can be realized with higher accuracy.

In the exposing system in particular, a pattern position detection system is set to the same conditions as optical conditions such as spectral illuminance (which may be a bright line spectrum of a mercury lamp, or monochromatic light such as a laser beam or the like, or polychromatic light) and illumination directivity of a pattern detection system, i.e., the alignment pattern detection system in the exposing device, or a numerical aperture or the like of a detection optical system. The position of an alignment pattern prior to exposure made by the exposing device is detected to thereby obtain first pattern position information. Further, the position of an alignment pattern is detected under the conditions of the detection optical system, which are most suitable for the detected alignment pattern and at the same wafer position as that at the time that the first pattern position information has been obtained, to thereby obtain second pattern position information. Thereafter, the difference between the first pattern position information and the second pattern position information is determined and fed forward to the exposing device as an alignment offset for the exposing device. In doing so, a proper offset correction can be performed even if the alignment pattern detection system of the exposing device is not set to the conditions most suitable for the alignment pattern on the wafer, for example, thereby making it possible to realize the superposition exposure with higher accuracy.

The function of the present invention will be described by the example shown in FIG. 14A–D. If the reflectance or reflectance ratio of the undercoat varies depending on the wavelength as shown in FIG. 14A, then the illumination falling on the undercoat through a filter having a spectral transmittance shown in FIG. 15A becomes equivalent to the fact that the reflectance ratio of the undercoat is constant and complete white illumination has been made as shown in FIG. 15B. That is, the conditions about multiple interference do not depend on the wavelength and the detected waveform is made symmetrical as shown in FIG. 15C. Thus, errors in detection, which are produced due to the multiple interference, are reduced.

The reflectance of the undercoat is not normally the above-described simple reflectance. In the case where the undercoat is of a multilayer structure in particular, its reflectance is taken as complex reflectance. Even in this case, the complex reflectance can be calculated from characteristics (spectral complex index of refraction) of a layer structure and a material of the undercoat. Alternatively, the complex reflectance may be optically measured. Therefore, if the optimum spectral intensity of the illuminating light is determined based on the so-obtained complex reflectance, the thickness of a film formed on the undercoat and the index of refraction and the illumination of such spectral characteristics is realized and detected by the above apparatus, then a high-precision detection can be performed.

According to the present invention as well, a chromatic aberration (chromatic bleeding) at a pattern edge, which occurs even in an ideal optical system, is no longer produced by making numerical apertures of a detection optical system, which differ from each other every detected wavelengths, identical every wavelengths, thus making it possible to carry out a perfect detection.

Even in the case of a non-ideal optical system which produces a chromatic aberration, a light beam reflected from an object to be detected is first focused on a light separating apparatus such as a diffraction grating. Thereafter, separated light beams are focused in a pattern detecting direction so as to produce images and focused in the direction orthogonal to the pattern detecting direction so as to form images on a two-dimensional image sensing device in a state of being spectroscopically separated, thereby making it possible to separately detect the images at respective wavelengths. As a result, chromatic aberrations of the images detected by the above optical system and formed with the chromatic aberrations held therein can be corrected by image processing.

Further, since the images formed at the respective wavelengths are separately detected, it is unnecessary to correct the spectral illuminance characteristics of the illuminating light on hard basis so that they reach desired spectral illuminance characteristics. That is, signals of the respective wavelengths are multiplied by constants different from each other in order to obtain the result equivalent to the fact that the illumination is applied onto the detected images formed at the respective wavelengths under the desired spectral illuminance characteristics. Thereafter, the resultant signals may be combined into one.

If a system capable of separately detecting the images at the respective wavelengths is adopted, then a desired wavelength used for detection light can be selected for each portion of a pattern depending on the thickness of each of films different from each other every portions of the pattern. It is therefore possible to achieve a detection capable of minimizing errors in detection.

BRIEF DESCRIPTION OF THE DRAWINGS

The present invention will be more apparent from the following detailed description, when taken in conjunction with the accompanying drawings, in which:

FIGS. 18A, 18B, 18C and 18D are views for describing a chromatic aberration correction executed by the present invention;.

FIG. 25 is a block diagram illustrating an exposing system according to the present invention; and.

DETAILED DESCRIPTION OF THE PREFERRED EMBODIMENTS

The present invention will hereinafter be described in detail by preferred embodiments with reference to the accompanying drawings.

Figure 1:
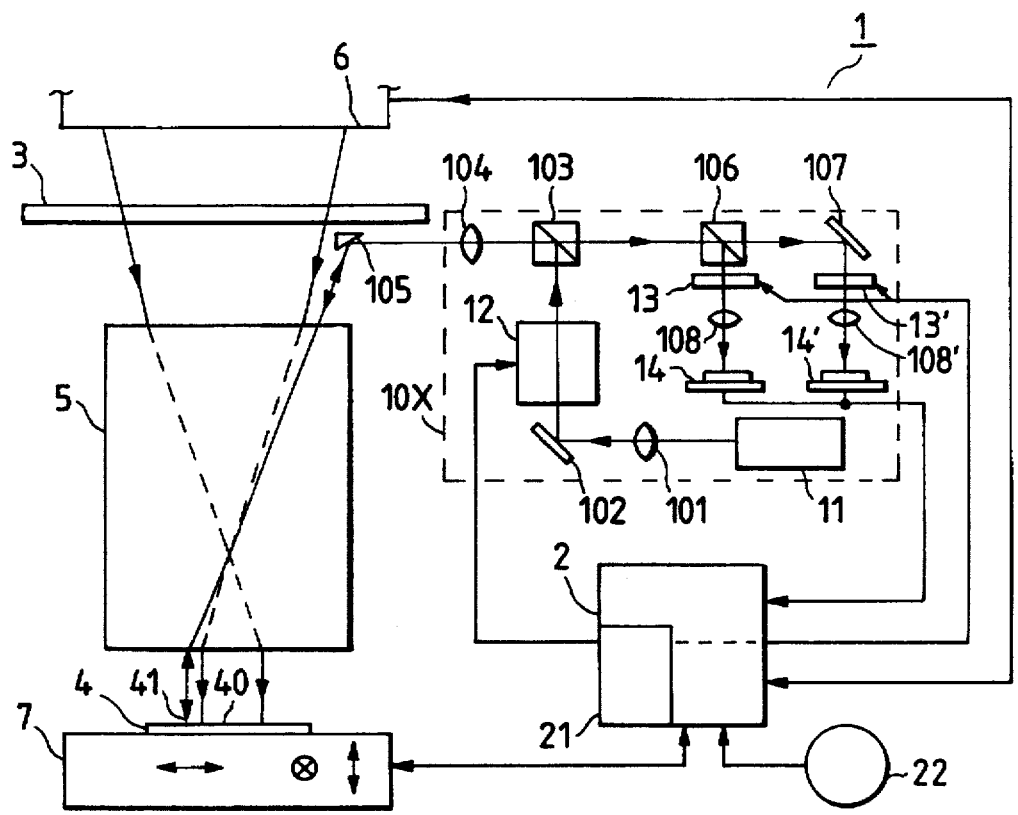
FIG. 1 is a block diagram showing a method of and a device for detecting each of a plurality of patterns, according to the present invention and a projection exposing device to which both the method and the device are applied.
Figure 2:
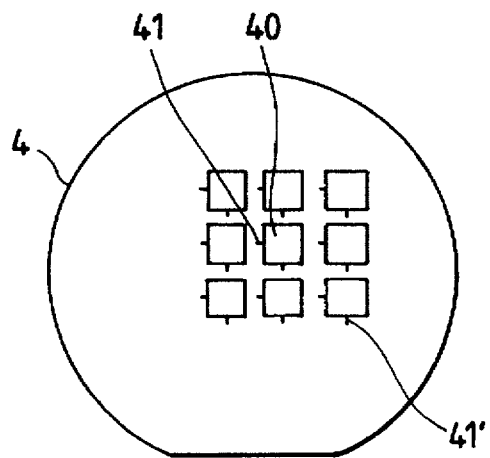
FIG. 2 is a plan view showing a circuit on a wafer corresponding to an object to be detected and patterns to be detected.
Figure 3:
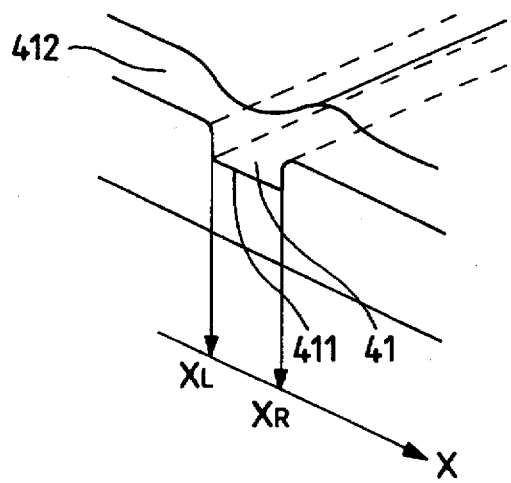
FIG. 3 is a perspective view illustrating the structure of a detected pattern;.

FIG. 1 shows one embodiment in which a method of detecting each of a plurality of patterns, according to the present invention is applied to a stepper (projection exposing device). An exposure illumination system 6 applies either an i beam or an excimer laser beam to a reticle 3. The light beam or light, which has passed through the reticle 3, is projected and exposed onto an exposure region 40 of a wafer 4 on a wafer stage 7 for enabling a pattern painted or drawn on the reticle 3 to be moved in x, y and z directions, through a scale-down or reduction lens 5. When the wafer stage 7 is moved stepwise in the x and y directions, regions of exposed circuit patterns are formed or arranged on a wafer 2 as shown in FIG. 2. Each of alignment patterns 41 is formed between the adjacent regions of the respective exposed circuit patterns to highly accurately realize the alignment of those patterns with the circuit patterns which have already been exposed and formed upon an exposure process. The alignment pattern 41 is constructed such that a photoresist 412 is applied on a primary pattern or an underpattern having a concave portion 411 defined therein as shown in FIG. 3. It is necessary to detect the position of each alignment pattern 41 using the reduction lens 5 with sufficient accuracy.

A detecting system for detecting the position of the alignment pattern 41, which extends in the x direction, is shown by reference numeral 10x as indicated by a broken line. Although not shown in the drawing, a detection system 10y for detecting an alignment pattern 41 used for a y-direction position, which extends in the direction orthogonal to the sheet is provided. The detection system 10x includes an illuminating light source 11 such as a halogen lamp, an xenon lamp or the like, which is used to detect each pattern. The light beam or light emitted from the illuminating light source 11 passes through a lens 101 which provides a desired beam diameter and directivity. After the light has been reflected by a mirror 102, it is transmitted through an apparatus 12 for adjusting a spectral intensity and the directivity or directional properties and providing illumination. The apparatus 12 sets the illuminating light to the optimum spectral illuminance distribution and brings the light of each wavelength to a desired directivity. The light transmitted through the apparatus 12 is reflected from a beam splitter 103 and passes through a lens 104 and a mirror 105. After the light has been transmitted through the reduction lens 5, the alignment pattern 41 on the wafer 4 is illuminated with the light. After the light reflected from the alignment pattern 41 has passed through the reduction lens 5 again, it is reflected from the mirror 105 so as to enter into the detection system 10x. The detected light passes through the lens 104 and the beam splitter 103 and is thereafter divided into two by a wavelength selection beam splitter 106.

The beam splitter 106 reflects light or a light beam having a wavelength of from $\lambda 1$ to $\lambda 2$ and causes light having a wavelength of from $\lambda 2$ to $\lambda 3$ to pass therethrough. Thus, the separation of the detected light into two wavelength bands or zones and detection of the same are carried out because, since the reduction lens 5 has been designed and produced to obtain the maximum resolution with exposure light, a large chromatic aberration is produced with respect to the light having a wide wavelength width of from $\lambda 1$ to $\lambda 3$ with the result that a color correction lens for correcting the chromatic aberration becomes hard to be fabricated. That is, so long as the detected light is separated into the two wavelength bands as shown in FIG. 1, the light having the wavelength of from $\lambda 1$ to $\lambda 2$ can be color-corrected by the lens 104 and a lens 108, whereas the light having the wavelength of from $\lambda 2$ to $\lambda 3$ can be subjected to color correction by the lens 104 and a lens 108'. The light having the wavelength from $\lambda 1$ to $\lambda 2$, which has been separated by the wavelength selection beam splitter 106, is transmitted through a apparatus 13 for adjusting and detecting a spectral transmittance and a numerical aperture. The apparatus 13 can detect the incoming light for each detected wavelength at the optimum detection numerical aperture. The light having the wavelength of from $\lambda 2$ to $\lambda 3$ which has been separated by the wavelength selection beam splitter 106, is reflected from a mirror 107 and detected for each wavelength by a apparatus 13' for adjusting and detecting a spectral transmittance and a numerical aperture at the optimum numerical aperture detected. Thus, the light detected at each detected wavelength band passes through each of the color correction lenses 108 and 108' so as to focus an image free of a color aberration on an image sensing surface of each of one-dimensional or two-dimensional image sensing devices 14 and 14' using each of the color correction lenses 108 and 108'.

Alignment patterns detected by the image sensing devices 14 and 14' are sent to a signal processing circuit 2, where the position of each pattern is detected. After the position of each alignment pattern on the wafer has been detected in this way, the wafer stage is finely moved and adjusted so that the patterns are properly subjected to an alignment or superposition and exposure process based on information about the result of detection and information about the position (normally measured by an unillustrated laser length-measuring machine) of a wafer table used when each pattern is detected, to thereby effect the superposition exposure process. The apparatus 12 and the apparatus 13 will be described in detail by embodiments later. In this case, however, the spectral intensity and directivity of the illuminating light adjusted by these apparatuses, and the spectral transmittance and numerical aperture to be detected are normally different in the optimum values from each other depending on structures and material characteristics of wafer patterns to be detected. These optimum values are calculated by off-line in advance and the calculated values may be inputted through an input terminal 22. Alternatively, as shown in FIG. 1, characteristic values about the structure and the material may be inputted through the input terminal 22 so that the optimum values are calculated by an optimum value calculating circuit 21.

In the embodiment shown in FIG. 1, the apparatus 12, and the apparatus 13 are used simultaneously. However, either one of an adjustment of the spectral intensity by the apparatus 12 and an adjustment of the spectral transmittance by the apparatus 13 is sufficient to achieve the above.

Figure 4:
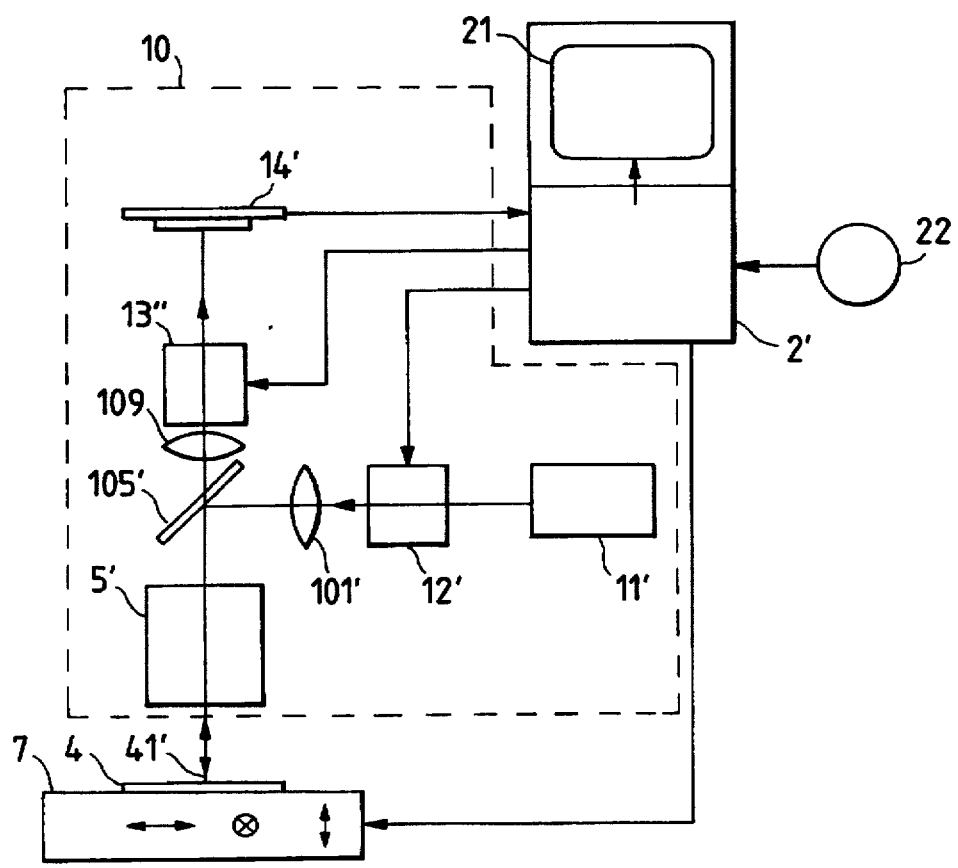
FIG. 4 is a block diagram depicting a method of and a device for detecting each of patterns, according to the present invention.
Figure 5:
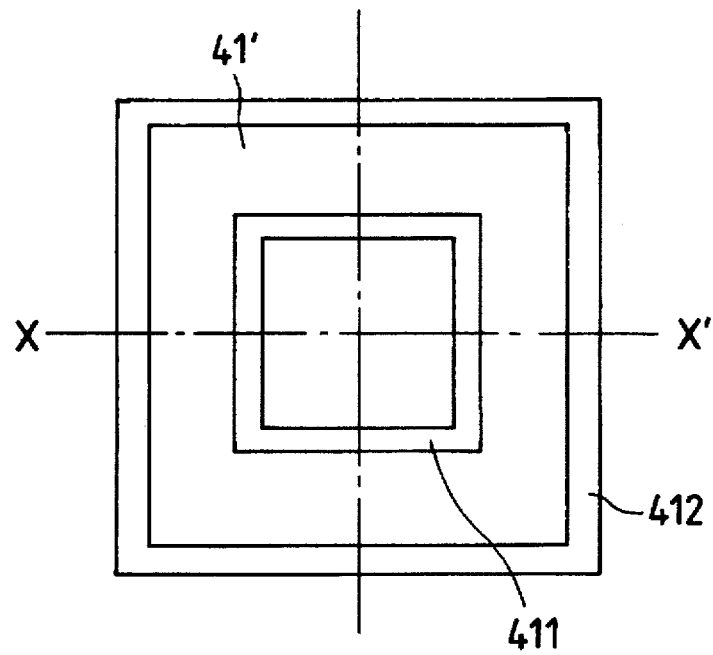
FIG. 5 is a plan view showing patterns corresponding to an object to be detected.
Figure 6:
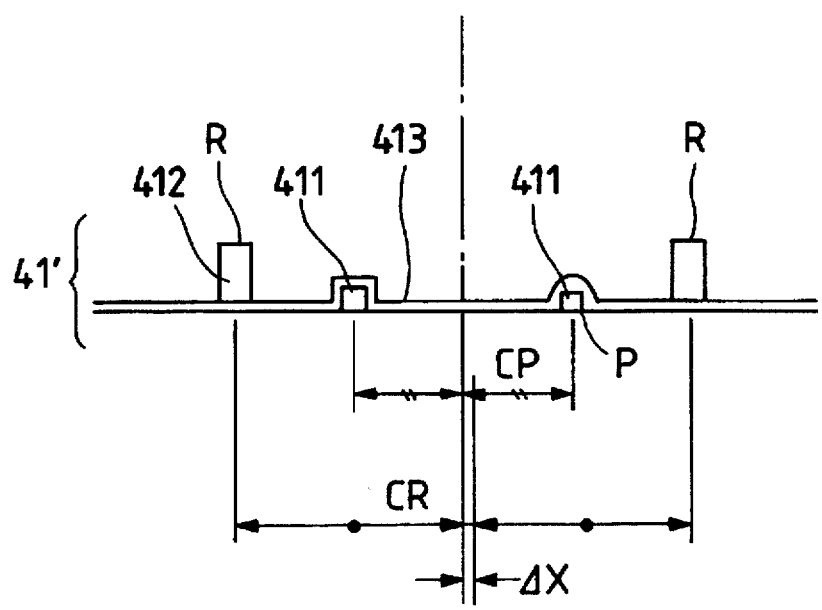
FIG. 6 is a cross-sectional view illustrating the patterns shown in FIG. 5.

FIG. 4 is a view for describing a method of detecting patterns, which has been applied to an alignment evaluating device. Reference numerals indicative of components shown in FIG. 4, which are identical to those shown in FIG. 1, indicate the same components as those in FIG. 1. For example, a resist pattern 412, which has already been subjected to the alignment or superposition exposure and developed, is formed on a wafer provided on a wafer table 7. That is, the resist pattern 412 is a pattern formed by being subjected to the superposition exposure. Another pattern 411 is a pattern formed before being subjected to the alignment or superposition exposure. In order to evaluate the accuracy of alignment of the patterns with each other in an x direction, a displacement between a detected center Cp located between the left and right portions of the pattern 411 of FIG. 6 showing a cross-section taken along line X–X' of FIG. 5 and a detected center Cr located between the left and right portions of the pattern 412 may be calculated. However, the normal pattern is shaped in the form of a multilayer structure as shown in FIG. 6. Particularly, when the uppermost layer is of an optically transparent layer, the normal patterns are subjected to multiple interference. Further, unless the pattern is irradiated with light having the optimum wavelength spectral characteristics, each detected waveform is distorted and misdetected correspondingly. Since the pattern 411 is different in layer structure from the pattern 412 in the present embodiment, a wavelength synthetically most suitable for the two is selected.

Reference numeral 11' shown in FIG. 4 indicates an illumination system. Light emitted from the illumination system 11' has a desired spectral intensity and a directional property corresponding to each wavelength both adjusted by a apparatus 12' for adjusting the spectral intensity and the directional properties and providing illumination. That is, a secondary light source or beam having a magnitude and an intensity different from each other for each wavelength is produced by the apparatus 12' as will be described later.

After such light has passed through a lens 101' and has been reflected from a beam splitter, an image of the secondary light beam is focused onto a pupil of an objective lens. The light beam, which has passed through the pupil of the objective lens, applies telecentric illumination to each of patterns on a wafer. The light reflected from the wafer passes through an objective lens 5', the beam splitter 105' and a condensing lens 109 and is focused on a two-dimensional image sensing device 14'. A apparatus 13" for adjusting and detecting a spectral transmittance and a numerical aperture is disposed between the condensing lens 109 and the two-dimensional image sensing device 14'. The apparatus 13 effects a light detection process at a numerical aperture set according to the wavelength of detected light.

In the above embodiment, the spectral intensity is varied by using the apparatus 12 and 13. However, either one of them will be enough. That is, if the spectral intensity of the illuminating light is adjusted to the optimum by the apparatus 12, for example, then the apparatus 13 may be set so as to have the same transmittance for each wavelength.

When a two-dimensional pattern detected by the method described in the present embodiment is detected by the two-dimensional image sensing device and a displacement between the center of the pattern 411 extending in the x and y directions and that of the pattern 412 extending in the x and y directions is determined, the accuracy of alignment of the centers with each other is obtained. Further, the optimum spectral intensity of the illuminating light and the numerical aperture of the optical system at the time of light detection or the directivity of the illuminating light vary depending on the layer structure and material of the wafer. Therefore, if such conditions are inputted from an input terminal 22, then a processing circuit 2' calculates the optimum spectral intensity of the illuminating light and the numerical aperture of the optical system at the time of the light detection or the directivity of the illuminating light and drives the apparatus 12 and 13. As a result, the optimum spectral intensity of the illuminating light and the numerical aperture of the optical system at the time of the light detection or the directivity of the illuminating light can be realized.

Figure 7:
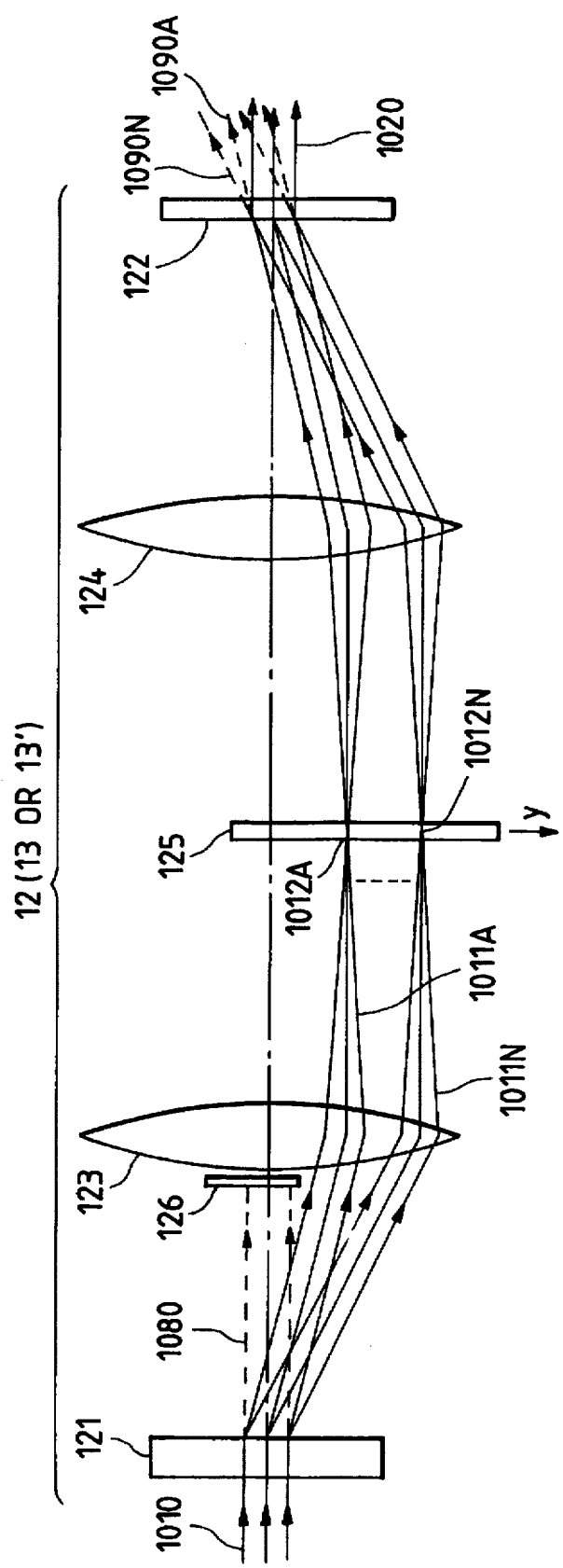
FIG. 7 is a cross-sectional view showing means for adjusting a light spectral intensity and a light directional property and providing illumination and means for adjusting and detecting a spectral transmittance and a numerical aperture, both of which are employed in the present invention.

FIG. 7 shows a specified example of the apparatus 12 employed in a device for detecting each of a plurality of patterns, according to the present invention. The example shown in FIG. 7 can also be used as one example of the apparatus 13 employed in the device according to the present invention by varying the structure of its part as will be described later. Reference numeral 121 indicates apparatus for separating light into its spectral components, such as a diffraction grating or a prism (not shown) or the like. The light emitted from the illuminating light source 11 (11') for detection is brought into light beams or light 1010 whose directivity has been improved or sharpened to some extent in a y direction shown in FIG. 7 and enters into the light separating apparatus 121. The illuminating light source for the detection has spectral intensities including all the wavelength regions to be detected but does not include spectral intensity characteristics most suitable for detection. Therefore, the light 1010 is spectrally separated or distributed into light beams 1011A through 1011N by the light separating apparatus so as to be concentrated on a spatial light transmittance modulator 125 by a condensing lens 123. When the diffraction grating is used, the light whose wavelength is shortest is concentrated on 1012A, whereas the light whose wavelength is longest is concentrated on 1012N. Since zero-order transmitted light of the light applied to the light separating apparatus 121 is not used, it is shielded or blocked by a light shielding or blocking plate 126. The light shielding plate 126 may be disposed in front of the condensing lens 123 as shown in FIG. 7. Alternatively, the light shielding plate 126 may be disposed on the spatial light transmittance modulator 125.

Figure 8A:
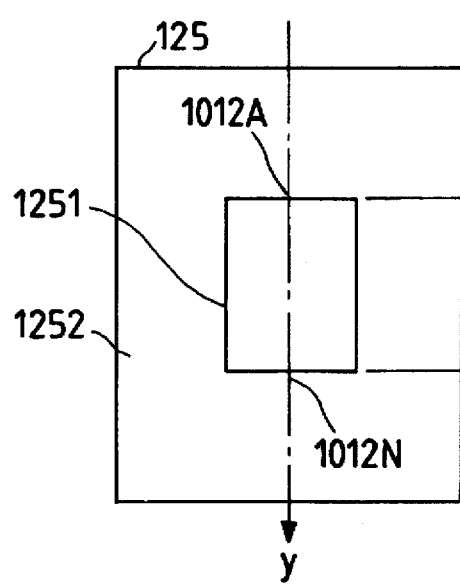
FIGS. 8A and 8B are a plan view of a first spatial light transmittance modulator and a graph for describing its transmittance.
Figure 8B:
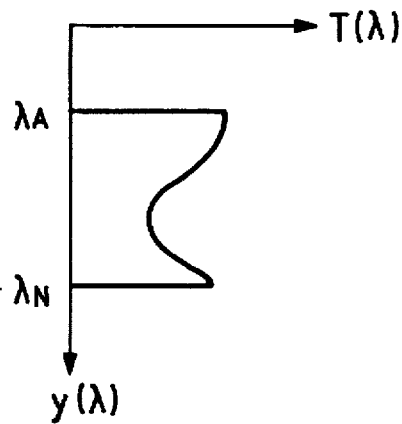
Figure 9A:
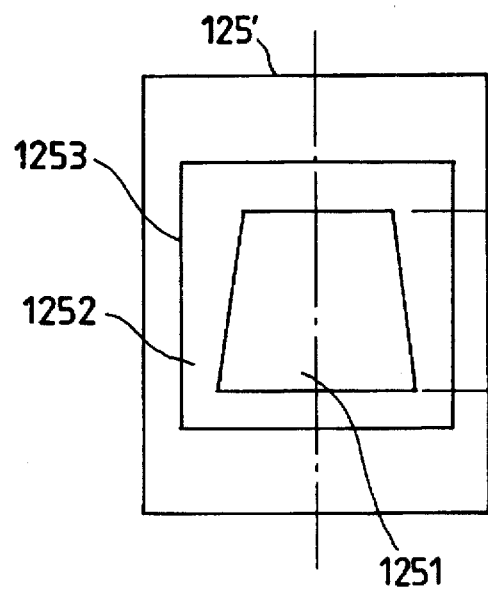
FIGS. 9A and 9B are a plan view of a second spatial light transmittance modulator and a graph for describing its transmittance.
Figure 9B:
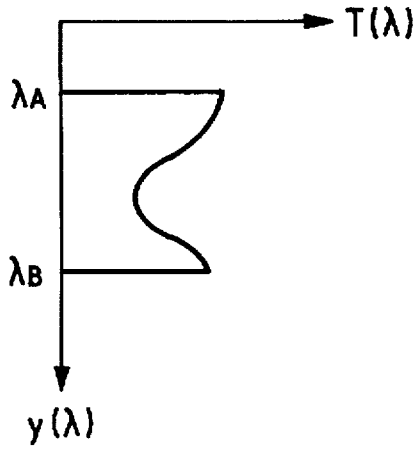
Figure 19A:
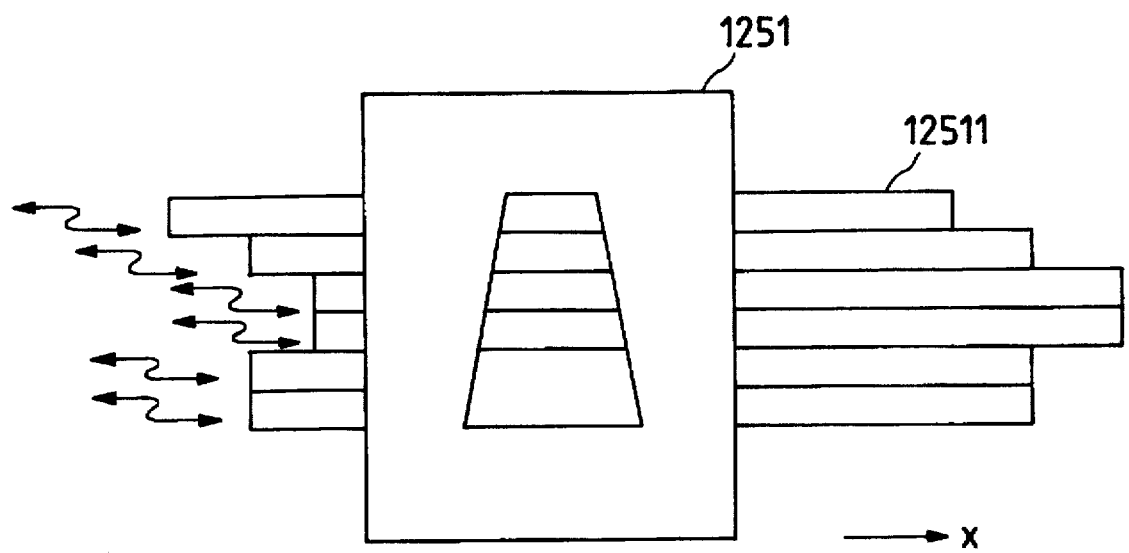
FIGS. 19A and 19B are views illustrating a spatial light transmittance modulator comprised of strip ND filters employed in the present invention and a graph for describing its transmittance.
Figure 19B:
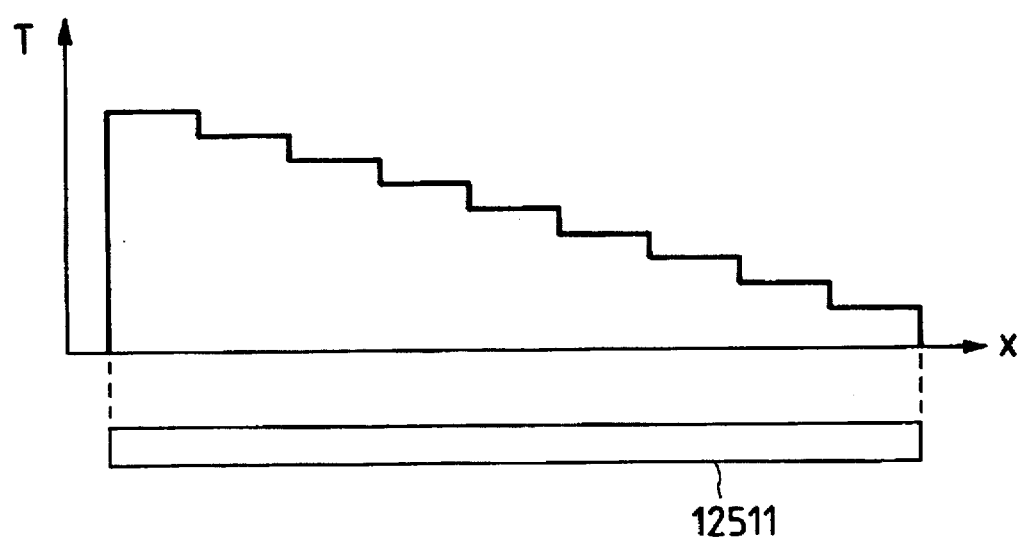

Then, the spatial light transmittance modulator 125 is set to a structure in which a light-transmissive portion 1251 is attached to a light intransmissive or blocking portion 1252 as shown in FIG. 8A. In this case, the light-transmissive portion 1252 causes a transmittance T (λ) to vary as shown in FIG. 8B so that the intensity of light of each wavelength is brought into the optimum light intensity after the light has passed through the light-transmissive portion 1252. As a method of partly varying the intensity of the light in this way, there are known those such as a liquid crystal shutter matrix, a PZT, a photochromic material, etc. Since the object of the present invention can be achieved even when variations in a y direction are changed in a stepwise manner, the following is considered as a simpler method. That is, each of strip ND filters elongated in an x direction and whose transmittance varies little by little in the x direction as shown in FIG. 9B, is set to a structure of such a type that it can be moved in the x direction. Further, a number of strips arranged in a y direction as shown in FIG. 19A may be controlled in the x direction so as to produce a desired transmittance shown in FIG. 8B.

A description will next be made of an embodiment for optimizing the directivity of illuminating light used to detect each light to be detected at the same resolution, using the equation (1) as described above with reference to FIGS. 9A and 9B. That is, in order to detect each light at the same resolution, a numerical aperture of a detection optical system, which is proportional to each wavelength k to be detected, is set to NA and a partial coherency of the illuminating light at each wavelength is set so as to coincide with the NA. A light intransmissive or blocking region 1251 within a region 1252 of a spatial light transmittance modulating region 1253 of a spatial light transmittance modulator 125' shown in FIG. 9A is set to a light-transmissive region. In the case of λB of a long wavelength, an NA for image detection is greater than that employed in the case of λA of a short wavelength. Further, the width of the light-transmissive region of the spatial light transmittance modulator 125' shown in FIG. 9A is made wider so that the illuminating partial coherence is proportional to the NA and made greater. A ratio between the widths of the two light-transmissive regions is set substantially equal to a ratio between the two wavelengths. An image can be detected for each wavelength in accordance with a desired NA (to be described later) and an illuminating partial coherence proportional to the NA by driving the whole region formed within the spatial light transmittance modulating region 1253 based on an electric signal, using the liquid crystal shutter matrix, the PZT or the like.

The light, which has passed through the spatial light transmittance modulator 125 or 125', falls on apparatus 122 for separating light into its spectral components, such as a diffraction grating, a prism (not shown) or the like through a condensing lens 124 shown in FIG. 7. Since the surface of the light separating apparatus 122 is conjugated with that of the light separating apparatus 121 owing to the existence of the lenses 123 and 124, an intensity distribution of the light falling upon the light separating apparatus 121, i.e., the light 1010 whose directivity has been improved or sharpened to some extent in the y direction as described above, is reproduced by the light separating apparatus 122. However, the intensity of the light varies for each wavelength because the light is modulated by the spatial light transmittance modulator 125. As a result, the light, which passes through the light separating apparatus 122 and undergoes diffraction, is applied to the wafer 4 with a desired illuminating partial coherence of illumination and a desired spectral illuminance distribution included therein.

FIG. 7 shows the apparatus 12 employed in the illumination system. However, if the apparatus 13 is employed in the detection system under the same structure as that of the apparatus 12 of FIG. 7, then a desired NA for detection can be applied to each wavelength described above and images to be detected can be identical in resolution to each other every wavelengths. That is, in this case, the apparatus 13 shown in FIG. 7 is situated in the position of each of the apparatus 13 and 13' employed in the embodiment shown in FIG. 1, for example. The light reflected from the pattern 41 on the wafer passes through the reduction lens 5, the mirror 105 and the beam splitter 103 and is reflected from either the beam splitter 106 or the mirror 107 so as to be focused on the light separating 121 shown in FIG. 7. Next, the focused light is diffracted at each of diffraction angles different from each other every wavelengths. Thereafter, the light passes through the lens 123, the spatial light transmittance modulator 125 and is focused on the light separating apparatus 122 by the lens 124 as an image of each pattern 41.

The width of the light-transmissive region 1251 of the spatial light transmittance modulator 125 varies so as to meet the equation (1) for each wavelength, i.e., along a vertical direction y as shown in FIG. 9A. However, when the transmittance is varied within the illumination system for each wavelength as shown in FIGS. 8B and 9B, it is not always necessary for the spatial light transmittance modulator 125' in the detection system to vary the transmittance for each wavelength. Each pattern focused again on the light separating apparatus 122 by the lens 124 falls on and is focused on the light separating apparatus 122 at each of incident angles different from each other every wavelengths. However, the diffracted light 1020, which is transmitted through the light separating apparatus 122, i.e., the light having each wavelength, travels along the same optical path. The diffracted and transmitted light is re-focused on the image sensing surface of each of the one-dimensional or two-dimensional image sensing devices 14 and 14' by the color correction lens 108 or 108' shown in FIG. 1 so as to form an image on the light separating apparatus 122.

The color correction lens 108 or 108' effects a correction about various aberrations including a chromatic aberration on the light within each wavelength bandwidth. Images corresponding to the light at the respective bandwidths are focused on their corresponding image sensing surfaces of the one-dimensional or two-dimensional image sensing devices 14 and 14' without any distortion and color aberration.

Figure 10A:
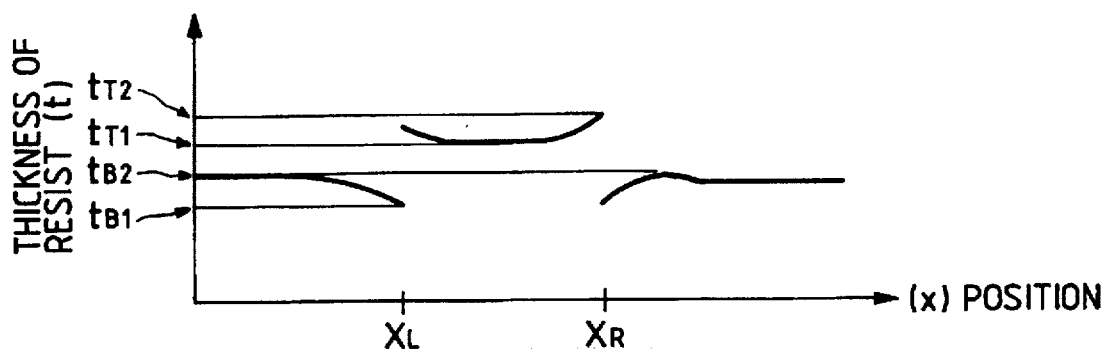
FIGS. 10A, 10B and 10C respectively illustrate a film thickness of a resist applied by a spin coater, a multiple interference intensity relative to the thickness of the resist and a desired spectral illumination intensity.

A method of specifically detecting each of the patterns will next be described using the construction of the embodiment showing the pattern detecting device described above. An objective pattern to be detected has such a layer structure as shown in FIG. 3. Therefore, when the uppermost layer of the pattern is of a photoresist, the thickness of the photoresist is illustrated in FIG. 10A.

The photoresist is normally applied by a spin coater. Therefore, if the center of the wafer is situated in an upper position on the left side, then the flow of the photoresist proceeds from left to right. As a result, the thickness of the photoresist is shown in FIG. 10A, that is, the thickness of the photoresist at the right end is greater than that of the photoresist at the left end. Consequently, the thickness range of the photoresist includes a thickness range from tB1 to tB2 and a thickness range from tT1 to tT2.

Figure 11A:
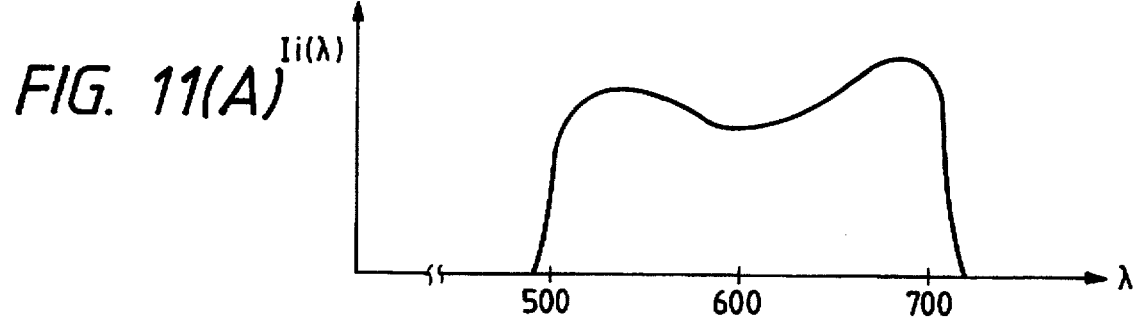
FIGS. 11A, 11B, 11C and 11D respectively illustrate a desired spectral illumination intensity, a spectral intensity of a light source, a spectral transmittance of an optical system, and a transmittance of a spatial light transmittance modulator of either one of the means shown in FIG. 7.
Figure 12:
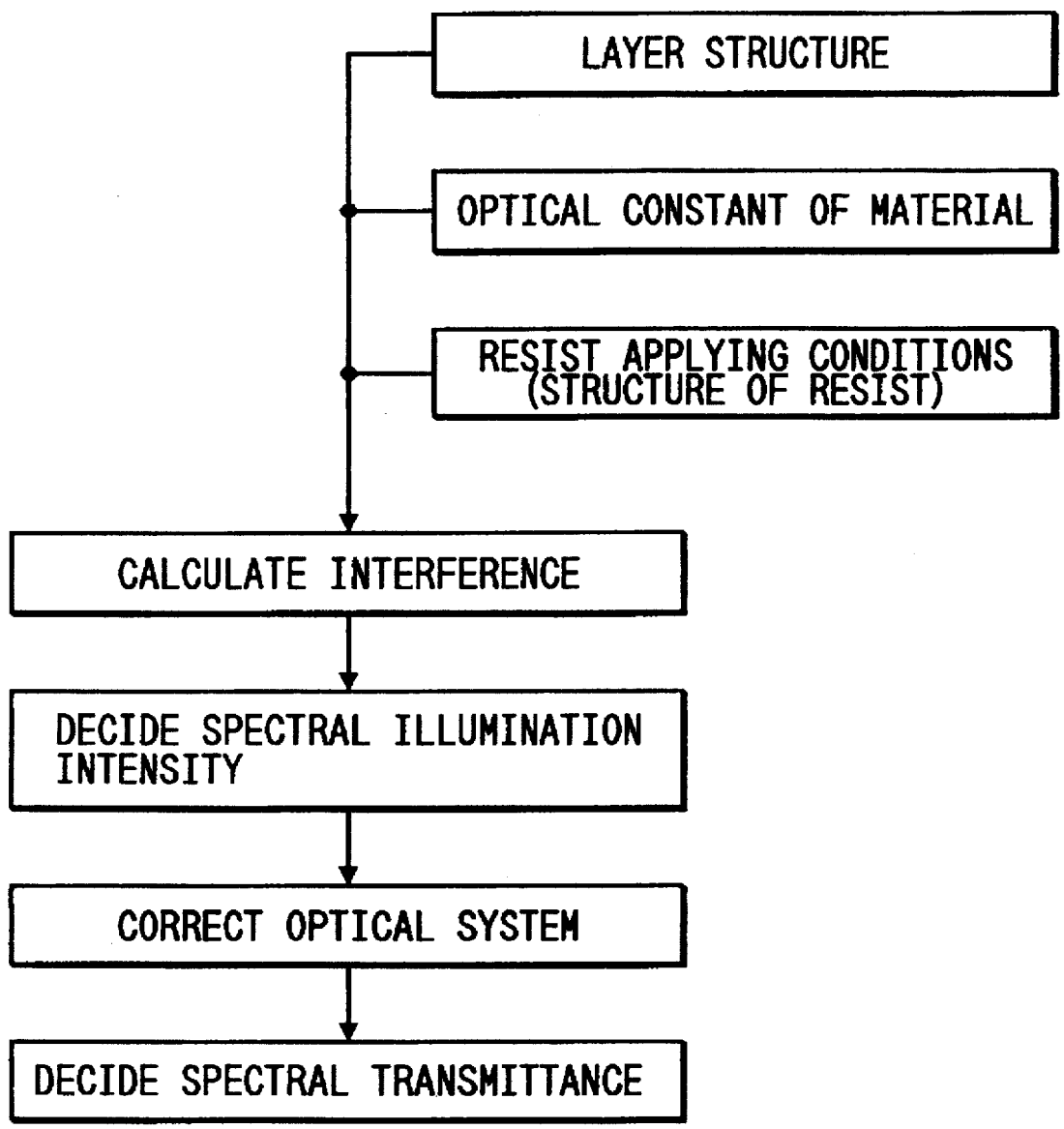
FIG. 12 is a block diagram showing a sequential process for deciding a spectral transmittance employed in the present invention.
Figure 13A:
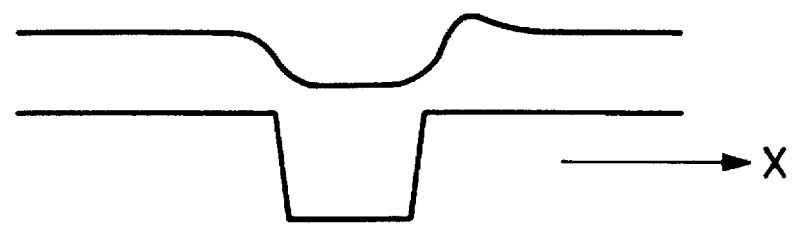
FIGS. 13A, 13B and 13C are views illustrating the structure of a cross section of a pattern at the time that the nonuniformity of application of a resist thereon occurs and waveforms detected by conventionally-used light having a monowavelength.
Figure 13B:
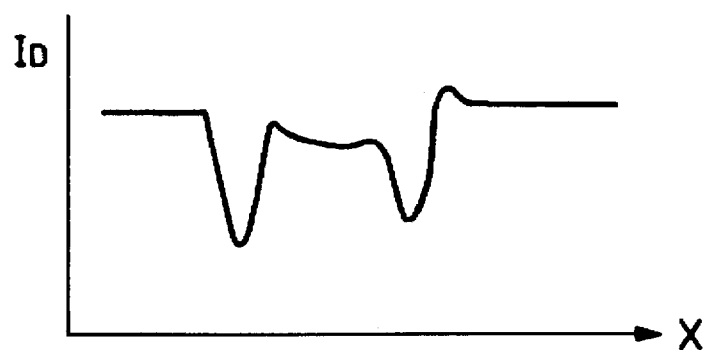
Figure 13C:
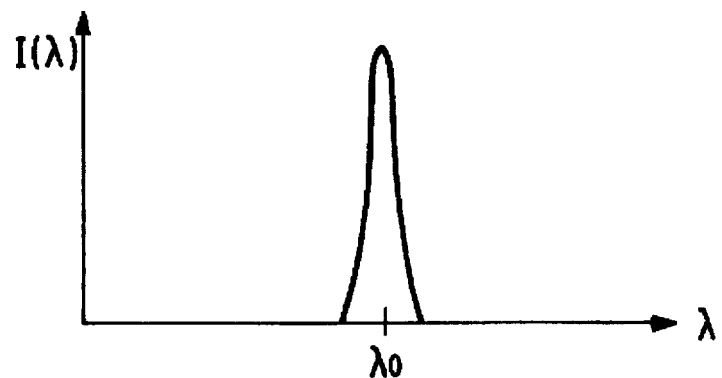
Figure 14A:
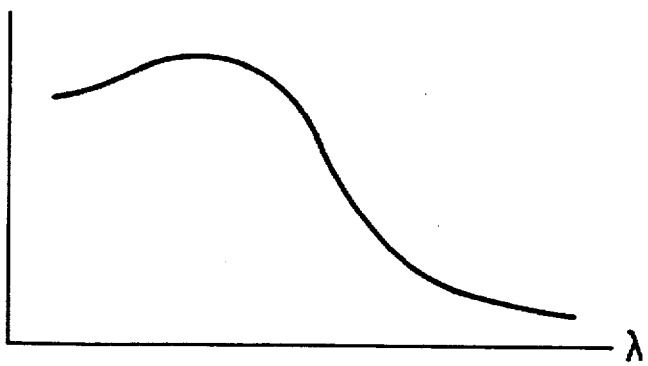
FIGS. 14A, 14B, 14C and 14D are views showing waveforms detected by conventionally-used white light where the wavelength greatly depends on a spectral reflectance of an undermaterial.
Figure 14B:
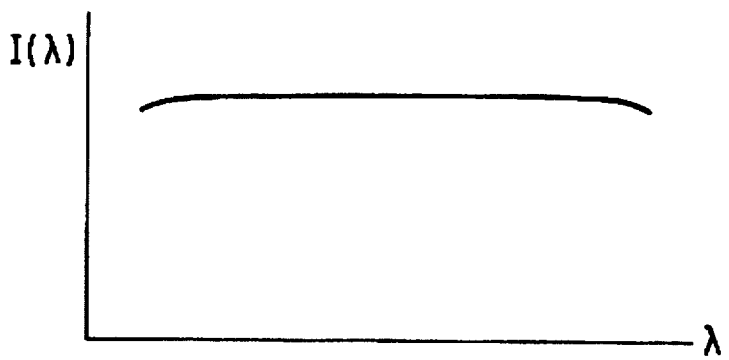
Figure 14C:
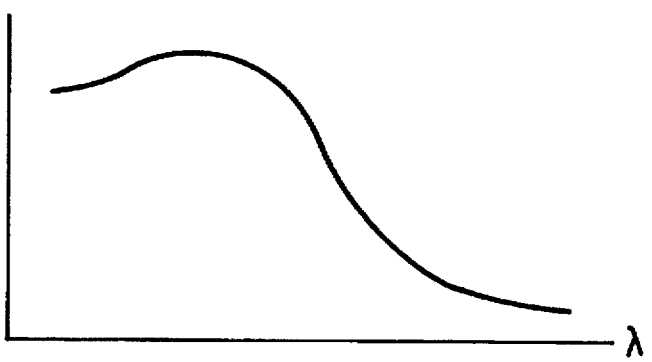
Figure 14D:
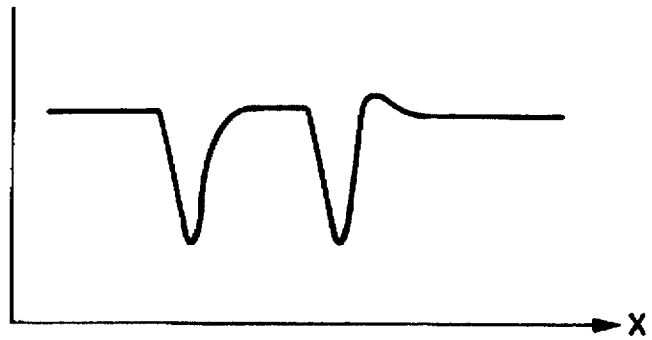
Figure 15A:
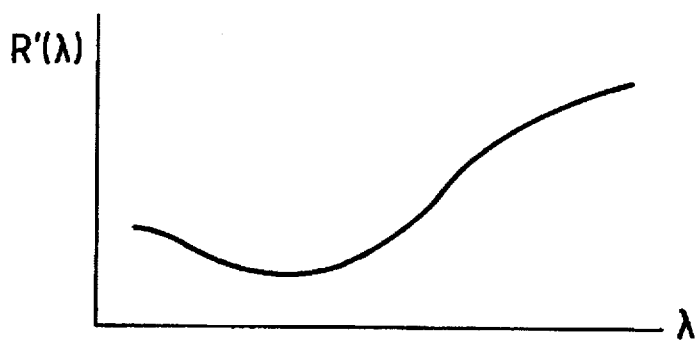
FIGS. 15A, 15B and 15C are views showing waveforms for describing the operation of the present invention.
Figure 15B:
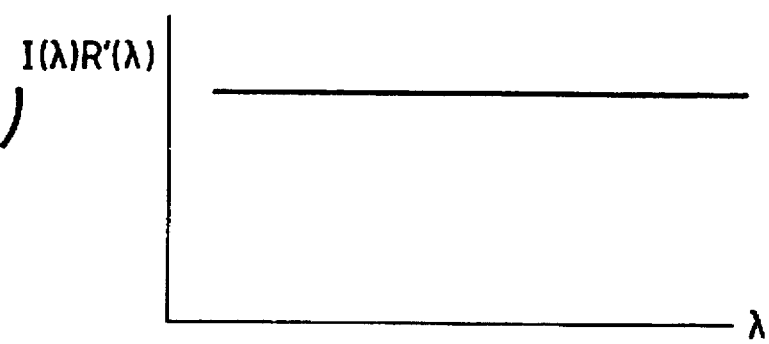
Figure 15C:
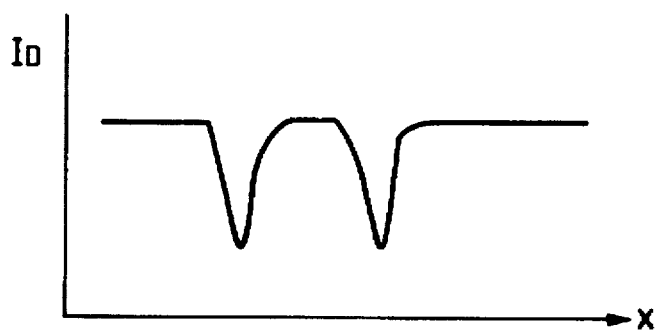

If such resist and layer structures and optical constants (complex index of refraction or the like) of materials for the resist and the underpattern are shown in advance, then an interference calculation is performed with these conditions as parameters as shown in FIG. 12. That is, when the wavelength is changed to another depending on each parameter, a variation in interference intensity is calculated. A decision is made as to at which spectral illumination intensity distribution the illumination may be made, based on the result of calculation. That is, a calculation is made as to whether a variation in interference intensity is small or the illumination intensity approaches a predetermined value within a resist-thickness range of FIG. 10A, i.e., between tB1 and tB2 and between tT1 and tT2. As a result, a desired spectral illumination intensity can be decided. A distribution Ii($\lambda$) of the so-decided spectral illumination intensity is as shown in FIG. 11A. This distribution simply corresponds to a spectral illuminance distribution of light for applying illumination to the wafer. Since a spectral intensity distribution of a light source and a spectral transmittance distribution of an optical system are not constant in practice, it is necessary to correct these distributions.

Figure 11B:
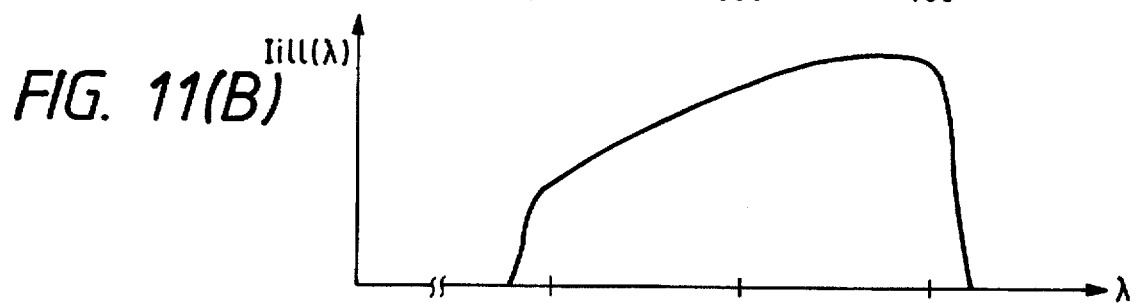
Figure 11C:
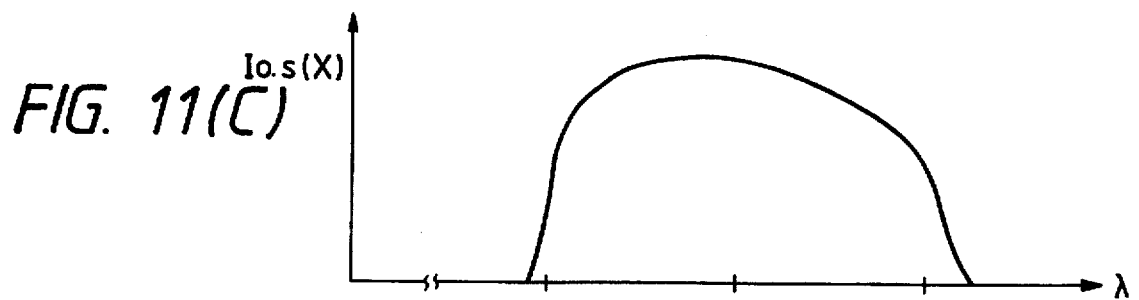
Figure 11D:
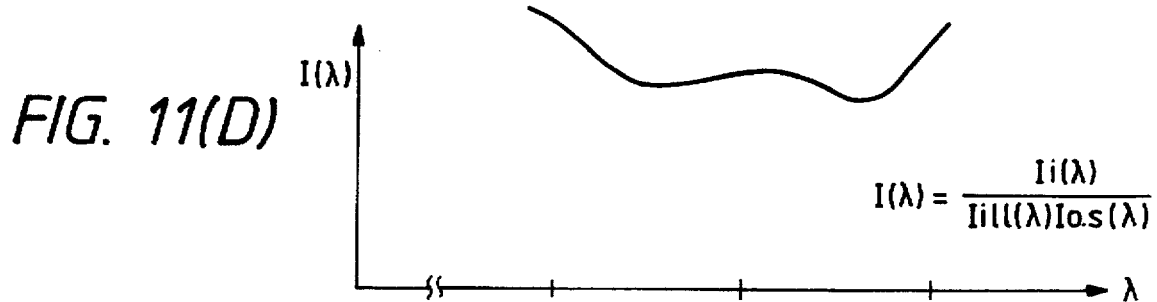

That is, when, for example, the spectral intensity distribution Iill($\lambda$) of the light source is as shown in FIG. 11B and the spectral transmittance distribution Ios($\lambda$) of the optical system is as illustrated in FIG. 11C, it is necessary to set a transmittance I($\lambda$) for each wavelength, of the spatial light transmittance modulator 125 to a value obtained in accordance with the following equation as shown in FIG. 11D:

$$I(\lambda) = \frac{Ii(\lambda)}{Iill(\lambda)Ios(\lambda)} \quad (2)$$

If the spatial light transmittance modulator 125 is driven so as to obtain the so-decided I($\lambda$), then the variation in interference intensity becomes small within the resist-thickness rage, i.e., between tB1 and tB2 and between tT1 and tT2. As a result, the waveform of a detected pattern is not affected by the unevenness produced upon applying the resist thereon and symmetrically formed. Thus, a high-precision pattern position detection can be realized.

Figure 16A:
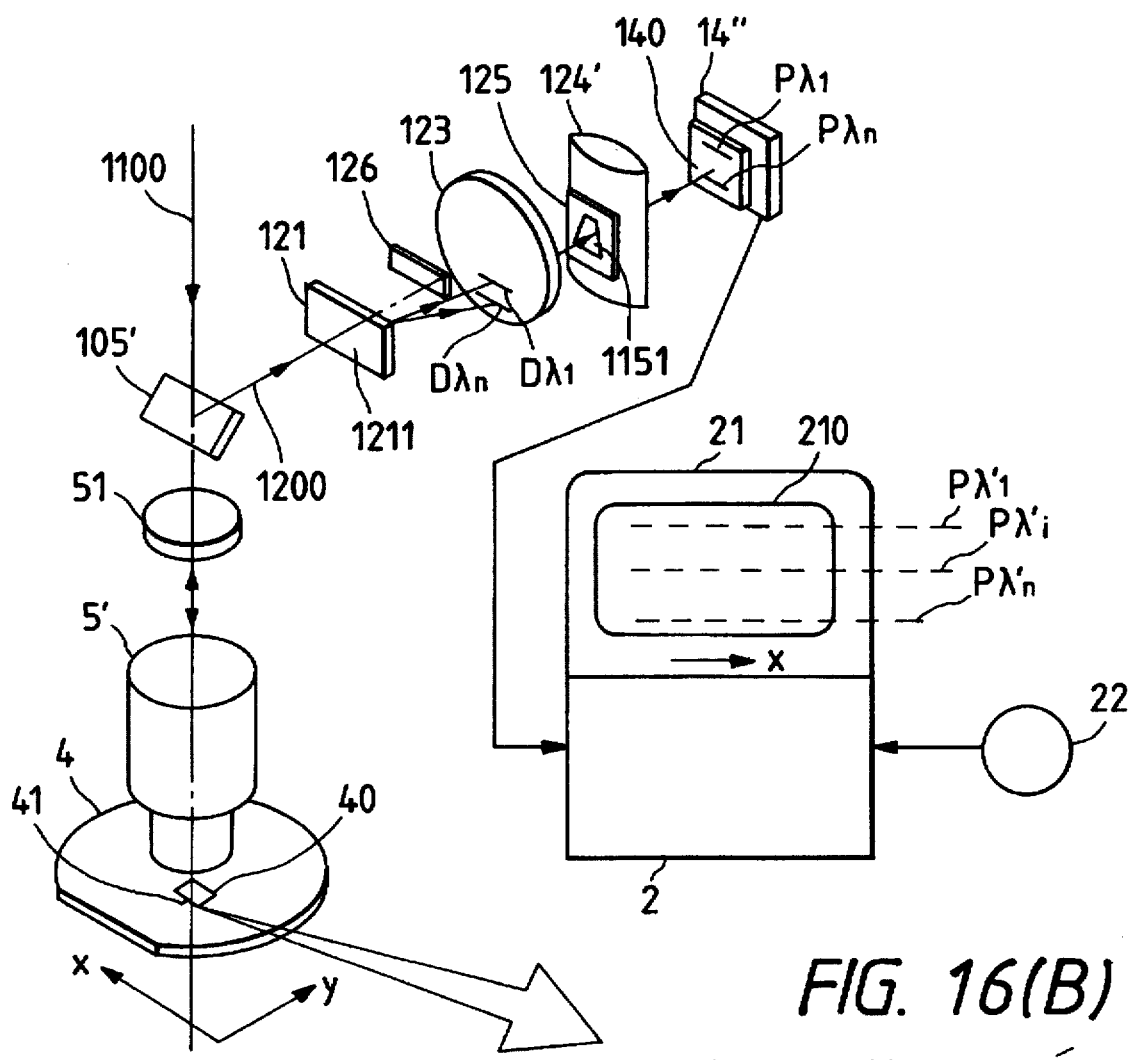
FIGS. 16A and 16B are block diagrams showing a method of and a device for detecting each of a plurality of patterns, according to the present invention.
Figure 16B:
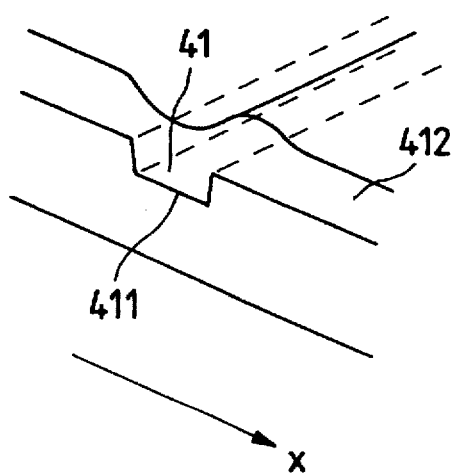

The pattern detecting method according to the present invention will be now described with reference to FIGS. 16A and 16B showing one example in which the method is applied to a device for detecting the position of each pattern. The pattern position detecting device according to the present embodiment is applied to either an off-axis alignment detection system of a stepper or a detection system for alignment evaluation. A detection mark 41 provided on a wafer 4 has a structure shown in FIG. 16B. Illuminating light 1100 is applied to an objective lens 5' for detection through a beam splitter 105', a condensing lens 51 and the objective lens 5'. The light reflected from the objective lens 5' is transmitted in the reverse direction along an optical path of the illuminating light 1100 and reflected by the beam splitter 105' to thereby produce detected light 1200. Thereafter, the detected light is focused on a apparatus 121 for separating the light into its spectral components to thereby form an image for the detected pattern. The light, which passes through the light separating apparatus 121 in a straight line, is blocked by a light blocking or shielding plate 126.

On the other hand, the angle of diffraction of the light diffracted by the light separating apparatus 121 varies for each wavelength. The light or light beam of a short wavelength and the light or light beam of a long wavelength are respectively concentrated on D$\lambda$1 and D$\lambda$n on the condensing lens 123. The light beams of the respective wavelengths, which have passed through the condensing lens 123, are made parallel to each other and pass through a numerical-aperture (NA) deciding aperture 1151. Thus, the NA varies depending on each wavelength as mentioned above. The light, which has passed through the numerical-aperture deciding aperture 1151, falls on a cylindrical lens 124'. The cylindrical lens 124', which is of a non-rotation symmetrical image-forming system, effects focusing or image-forming action in a pattern-position detecting direction x but does not effect the image-forming action in the direction orthogonal to the pattern-position detecting direction x. Accordingly, spectral one-dimensional images, which remain spectrally separated, are formed on an image sensing surface 140 of an image sensing device 14" along a y direction, i.e., images are formed on the image sensing surface 140 thereof along an x direction in a state in which patterns on the wafter are being enlarged and focused. The images are focused on the image sensing surface 140 side by side in the longitudinal direction y for every colors.

That is, images produced from light or light beams having wavelengths ranging from $\lambda$1 to $\lambda$ are formed at positions of P$\lambda$1 to P$\lambda$ on the image sensing surface 140. Thus, the images having the respective wavelengths are formed on a television monitor 210 of a signal processing device 21 at the positions of P$\lambda$1' ..., P$\lambda$' ..., P$\lambda$' depending on the respective wavelengths, so that detected signals are obtained every wavelength.

Figure 17A:
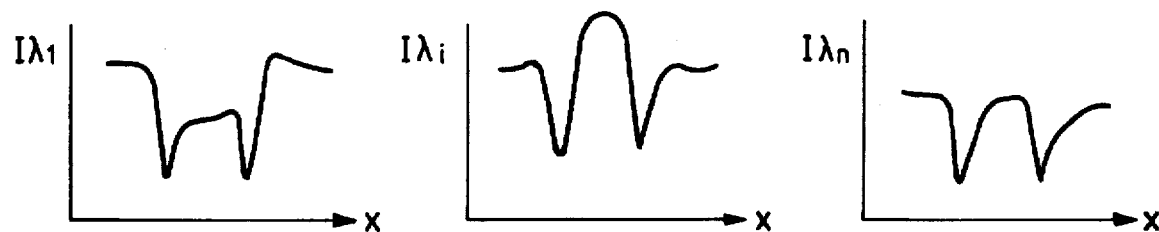
FIGS. 17A, 17B and 17C are views for describing detected waveforms.

A method of detecting patterns by the signal processing circuit 21 using the signals which have been separated and detected every wavelength in this way, will be described below. Detected waveforms respectively having wavelengths $\lambda$1, $\lambda$ and $\lambda$, of waveforms having their corresponding wavelengths which have been detected by the image sensing device 14", are represented as I$\lambda$(x), I$\lambda$(x) and I$\lambda$(x) shown in FIG. 17A. The levels of these detected waveforms are affected by the spectral intensity distribution I($\lambda$) of the light source and the spectral transmittance distribution Ios ($\lambda$) of the optical system. In order to obtain the optimum spectral illumination intensity I($\lambda$) as described above based on the thickness of a resist at each portion of a pattern and a structure and a material of an undercoat, one obtained by multiplying the detected waveforms I$\lambda$1(x), I$\lambda$ (x) and I$\lambda$ (x) by a correction value $\alpha$ ($\lambda$) may be used as the optimum detected waveform.

$$\alpha(\lambda i) = \frac{Ii(\lambda i)}{Iill(\lambda i)Ios(\lambda i)} \quad (3)$$

Accordingly, the optimum detected waveform I (x) which is finally obtained, is determined from the following equation:

$$I(X) = \sum_{i=1}^{n} I\lambda i(X)\alpha(\lambda i) \quad (4)$$

Figure 17B:
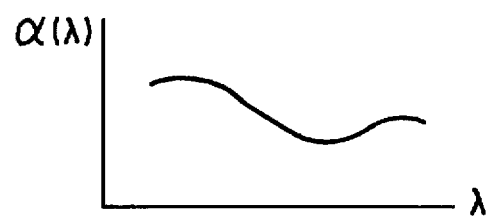
Figure 17C:
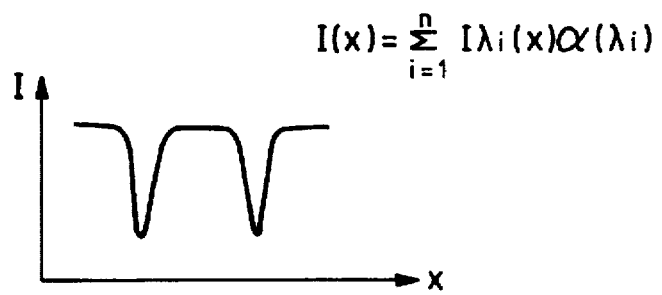

The so-determined detected waveform is as shown in FIG. 17C.

Another embodiment according to the present invention, which describes signal processing, will next be described below. The detection optical system shown in FIG. 16A makes use of an optical system wherein a chromatic aberration correction is effected on the detected light or light beam. Since, however, a normal microscopic objective lens is used for visual observation, this is quite fit for use unless bleeding occurs in color when an object is visually observed. In the case of alignment evaluation, however, it is necessary to evaluate the accuracy of alignment at a tolerance or precision of 10 nm or so. Therefore, a chromatic aberration of such an extent that a chromatic aberration decision cannot be made by the visual observation also exerts an influence on the accuracy of evaluation. Thus, an evaluation decision about to which extent the chromatic aberration remains in a state in which the optical system shown in FIG. 16 has been assembled, is made. When the accuracy of alignment is evaluated, it is of importance to correct the remaining chromatic aberration and effect a detection and evaluation process in a state in which the chromatic aberration is of 0.

The present embodiment can realize such a process. That is, an interference filter or the like is provided in front of the illuminating light source or the image sensing surface of the image sensing device in the state in which the optical system shown in FIG. 16 has been assembled. Further, a chromatic aberration detected at a single wavelength is evaluated in advance. A concave pattern having predetermined dimensions is formed in an Si wafter, for example. This pattern is detected using various monowavelengths or a light beam narrow in bandwidth. Further, the detected position of pattern and either the width or interval of the pattern are measured. FIG. 18A shows one example of the result obtained by evaluating the chromatic aberration in this way. That is, the axis of abscissa represents a wavelength, whereas the axis of ordinate shows a transverse magnification. When transverse magnifications differ from each other at wavelengths such as $\lambda 1$, $\lambda$ and $\lambda$ or the like, the signals corresponding to the respective wavelengths, which have been detected in the embodiment shown in FIG. 16, are different in pattern width from each other like W$\lambda 1$, W$\lambda$ and W$\lambda$.

Since, however, waveforms having these wavelengths are independently obtained, the magnification can be corrected by using the transverse magnifications M($\lambda 1$), M($\lambda$), M($\lambda$), etc. which have been determined in accordance with the above method. FIG. 18C shows the result of correction. Namely, according to the result of correction, the patterns are identical in width or interval to each other even in the case of any wavelength. Further, the detected positions of the patterns can be brought into alignment.

If the spectral illumination intensity or the like described in FIG. 17 is corrected after the magnifications have been corrected, then an ideal pattern shown in FIG. 18D can be detected. That is, the present embodiment can attain the following process. The chromatic aberration that cannot be completely removed by the optical system is spectroscopically detected to thereby separate and detect the waveforms at the respective wavelengths from the result of detection. Thereafter, corrections (such as a color magnification correction, a correction of an offset (position displacement) for each color at the detected center of pattern and a correction of a position displacement at each color, which is attributable to image distortion produced at each color) corresponding to coordinates of the detected positions can be effected on such waveforms. Further, a level correction can be effected on each waveform for each detected signal.

Since the detected waveforms can be obtained every wavelengths even when the nonuniformity of illumination occurs for each wavelength of illuminating light, for example, the pattern detecting device shown in FIG. 16A can easily correct such nonuniformity for each wavelength in addition to the above corrections.

A description will further be made of excellent points of the pattern detecting device shown in FIG. 16A. As shown in FIGS. 16B and 10A, the resist around the periphery of the concave pattern and that at the pattern (concave portion) are different in thickness from each other. The spectral intensity of illumination most suitable for the thickness of the resist about or around the concave pattern exists but is not always coincident with that of the pattern. In this case, the present embodiment makes use of $\alpha(\lambda)$ given by the equation (3) which are different from each other every wavelength portions, since the detected waveforms are obtained every wavelengths. That is, if $\alpha(\lambda)$ is defined as a function of a coordinate x, then $\alpha(\lambda)$ can be set to the optimum value depending on a difference in thickness between the respective portions of the resist, which are selected depending on their locations. As a result, the detected waveforms free of distortion can be obtained and the patterns can be detected with highest accuracy. When such a $\alpha(\lambda)$ is defined as a function $\alpha(\lambda, x)$ of the coordinate x, discontinuity appears at pattern edges xL and xR as shown in FIG. 10A, for example. Since discontinuous portions and distortion occur in each of the detected waveforms when such discontinuity appears, a process for smoothly lasting or extending the discontinuous portions without interruption is executed.

The embodiment shown in FIG.16A shows only the optical system for detecting each pattern extending in the x direction. However, when it is desired to detect the two axes or x and y axes, the beam splitter may be inserted between the light separating apparatus 121 and the focusing lens 51. Further, a detection system (detecting each pattern extending in the y direction) that is similar to that extending in the x direction may be provided.

The apparatus 12 and 13 employed in the pattern detecting device according to the present invention have been described with reference to FIG. 7, whereas the apparatus 13 has been described with reference to FIG. 16A. However, the optimum spectral directivity with respect to each wavelength set by the apparatus 13 exists. That is, in order to set the same resolution to any detected wavelengths as described above, NA is changed for each wavelength in such a manner that the resolution L given by the equation (1) is set to each of values substantially identical to all the detected wavelengths. Further, a partial coherence $\sigma$ (opening or aperture for deciding the numerical aperture to be detected when an object to be detected is flat, i.e., the ratio of a spread of light reflected from the object to the above aperture) of illumination, which is decided with respect to the NA($\lambda$) is set to a substantially constant value regardless of the wavelength. In doing so, MTF(M T F) becomes identical to any wavelength, so that a combined waveform of a desired wavelength, which can minimize distortion, can be obtained.

Another embodiment according to the present invention, for separating two-dimensional patterns in x and y directions and two-dimensionally and simultaneously detecting the same along the x and y directions without independently detecting the x and y directions will next be described with reference to FIG. 20.

Figure 20A:
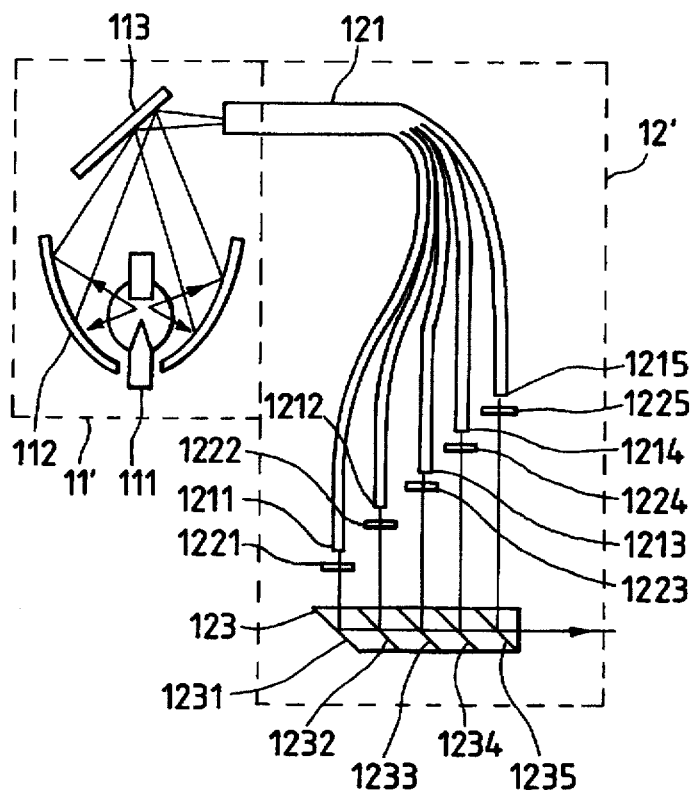
FIGS. 20A and 20B are block diagrams showing an illumination system employed in the present invention, which is used when two-dimensional patterns are detected.
Figure 20B:
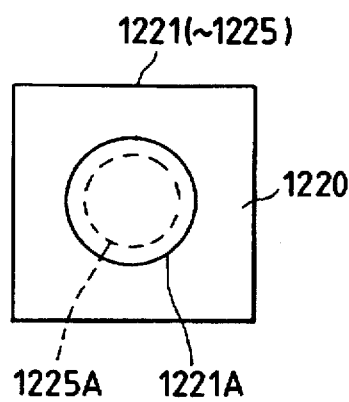

FIGS. 20A and 20B shows the embodiment descriptive of an illumination system used for two-dimensionally and simultaneously detecting the patterns. A detecting light source 11' causes an ellipsoidal mirror 112 to reflect light or light beams emitted from either a mercury lamp or a xenon lamp 111 from a mirror 113, thereby concentrating the same on an incident terminal of an optical fiber 121. The optical fiber 121 is divided into a plurality of bundles of fibers in the course of the optical fiber 121. Light-beam emission terminals 1211, 1212, 1213, 1214 and 1215 of the plurality of divided fibers are provided such that their positions extending in optical-axis directions thereof are shifted or displaced as shown in FIG. 20. Wavelength selection filters and apparatus 1221, 1222, 1223, 1224 and 1225 for adjusting the directivity and effecting illumination are situated in positions immediately after the light-beam emission terminals.

That is, the apparatus 1221 causes light beams having wavelengths ranging from 640 nm to 700 nm to pass therethrough. Further, the apparatus 1221 is superimposed on an ND filter or the like so as to produce a desired light intensity. Each of the wavelength selection filters and the apparatus 1221, 1222, 1223, 1224 and 1225 has an aperture 1221A provided inside a light blocking or shielding portion 1220 and indicated by the solid line, which is open as shown in FIG. 20B.

Similarly, the apparatus 1222 causes a light beam having a wavelength range of 580 nm to 640 nm to pass therethrough. The apparatus 1223, 1224 and 1225 also cause light beams respectively having wavelength ranges of 520 nm to 580 nm, 460 nm to 520 nm and 400 nm to 460 nm to pass therethrough. Further, each of the respective apparatus is superimposed on either an ND filter or a liquid crystal shutter or the like capable of varying the transmittance in response to an electric signal to thereby produce a desired light intensity. In the case of the light- beams emission terminal 1215, for example, an aperture 1225A indicated by the dot line in FIG. 20B is open. The light beams, which have passed through the respective wavelength selection filters and the respective apparatus, fall upon a wavelength selection beam splitter 123.

A reflecting surface 1231 performs total reflection. On the other hand, a reflecting surface 1233, for example, reflects light or a light beam having a wavelength of 580 nm or less and causes light having a wavelength of 580 nm or more to pass therethrough. The light, which has passed through the wavelength selection beam splitter 123, is used as illuminating light for a detection optical system. Now, consider that the illumination system 12' is employed in the embodiment shown in FIG. 4 by way of example. Each of the apertures 1221A through 1225A is opened to focus a light beam on an entrance pupil of the pattern detection lens 5' through the lens 101' so as to produce an image. The Koehler illumination light having an illumination directivity proportional to the diameter of the image can be applied to a pattern to be detected.

Thus, the incoming light beam can be separated into light beams corresponding to individual wavelength bands and such light beams can be set to desired intensity ratios. Further, each of the light beams can be set to a desired illumination directivity so as to be applied to the object to be detected. Since the directivity of the illumination has a rotation symmetric property about the optical axis in the present embodiment, desired illumination can be achieved regardless of the fact that the pattern corresponding to the object to be detected is either one-dimensional or two-dimensional.

A further embodiment showing a detection optical system used to two-dimensionally and simultaneously detect patterns will next be shown in FIG. 12.

Figure 21A:
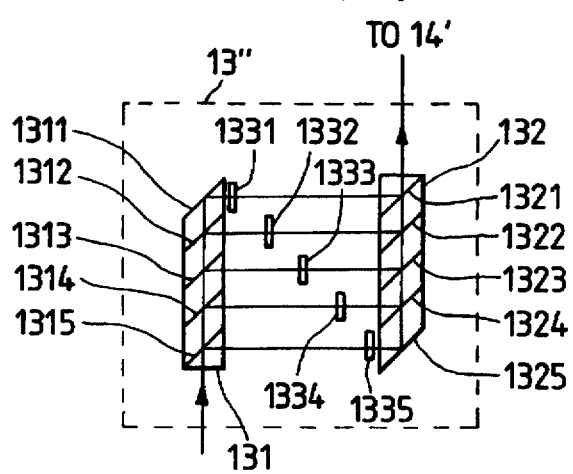
FIGS. 21A and 21B are block diagrams illustrating a detection system employed in the present invention, which is used when two-dimensional patterns are detected.

Light or a light beam reflected from a pattern on a wafer which has been illuminated by a apparatus 12' for adjusting a spectral intensity and directivity, which is employed in the embodiment shown in FIG. 20, passes through the detecting objective lens shown in FIG. 4 and is then enlarged and focused on a two-dimensional image sensing device 14' to thereby produce an image. Before the image is detected by the two-dimensional image sensing device 14', it is caused to pass through a apparatus 13" for adjusting and detecting a spectral transmittance and a numerical aperture, which is shown in FIG. 21. When the apparatus 13" is applied to the embodiment shown in FIG. 4, apparatus 1331, 1332, 1333, 1334 and 1335 for adjusting and detecting spectral transmittances and numerical apertures at the respective wavelength bands are situated in a focal position substantially on the rear side of the focusing lens 109. The respective wavelengths are separated by a beam splitter 131 until the light reaches the respective apparatus. This beam splitter 131 is basically identical to the beam splitter 123 shown in FIGS. 20A and 20B.

Figure 21B:
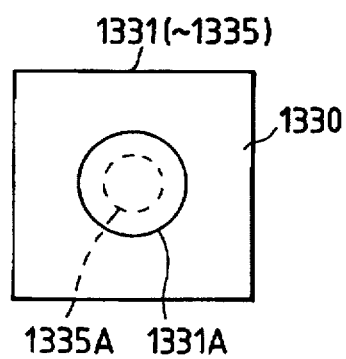

The apparatus 1331, 1332, 1333, 1334 and 1335 respectively have apertures 1331A through 1335A each open and defined in the center of a light blocking or shielding portion 1330 as shown in FIG. 21B. A numerical aperture NA to be detected is decided depending on the diameter of each aperture. The respective light beams, which have passed through the respective apertures, are combined into one light beam by the beam splitter 132 again. Thereafter, an image corresponding to the combined light beam is focused on the two-dimensional image sensing device 14'. Incidentally, the beam splitter 132 is different from each of the beam splitters 131 and 123. For example, a reflecting surface 1323 causes light or a light beam having a wavelength of 520 nm or less to pass therethrough and reflects a light beam having a wavelength of 520 nm or more. The diameter of each of the apertures 1331A through 1335A is decided in such a manner that resolutions or resolution capabilities at the respective wavelength bands are substantially equal to each other, e.g., the resolutions given by the equation (1) are substantially equal to each other at the centers of the respective wavelength bands. In doing so, each pattern can be detected substantially at the same resolution and at the optimum spectral illumination characteristic depending on the structure and material of the object to be detected.

Figure 22A:
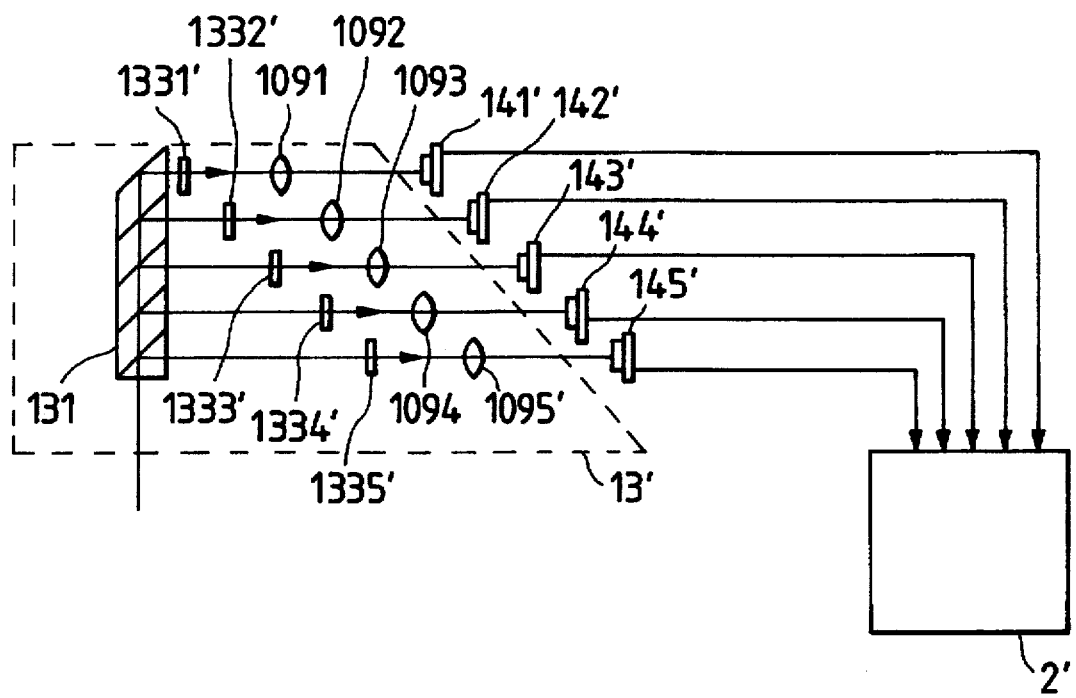
FIGS. 22A and 22B are block diagrams showing another detection system employed in the present invention, which is used when two-dimensional patterns are detected and an image sensing surface of an image sensing device.

FIG. 22A shows a still further embodiment according to the present invention. The present embodiment is different from the embodiment shown in FIGS. 21A and 21B and describes where a detected bundle of light beams reflected from a pattern to be detected are separately detected by a two-dimensional image sensing device in a state of being separated into respective wavelength zones or bands. The light beams separated into the respective wavelength bands by a beam splitter 131 are detected and processed at desired detection numerical apertures NA every wavelength bands by apparatus 1331', 1332', 1333', 1334' and 1335' for adjusting and detecting numerical apertures, after which they are focused on two-dimensional image sensing devices 141', 142', 143', 144'and 145' through focusing lenses 1091, 1092, 1093, 1094 and 1095 respectively. The detected signals corresponding to the respective wavelength bands, which have been obtained by the two-dimensional image sensing devices are inputted to a signal processing circuit 2'.

Figure 22B:
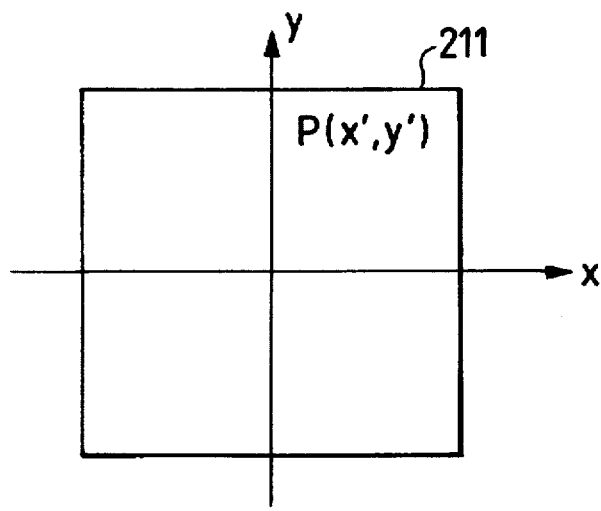

A coordinate (x', y') at a desired point P on an image sensing surface of each image sensing device shown in FIG. 22B is affected by aberrations such as a chromatic aberration or the like included in a detection optical system and is different from an image-forming point or a focused point PO(x, y) at the time that the detection optical system is of an ideal optical system free of the aberration. Now, consider that an ith wavelength band is represented as k and a relationship between the point P(x', y') and the point P0(x, y) in an image-forming system of the wavelength band k is given by the following equation 5.

$$(x, y) = P\lambda i(x', y') \tag{5}$$

where (x, y) and (x', y') represent position vectors on a two-dimensional coordinate, and $P\lambda$ represents a coordinatetransformation function varied for each wavelength band λ. i.e., a function indicative of distortion produced due to the aberration. A function Pλ (x', y') forms regularly cross-cut patterns on a wafer, for example. Thus, an image can be detected by using the patterns and hence a two-dimensional pattern can be determined based on a signal indicative of the position of the detected image.

Figure 10B:
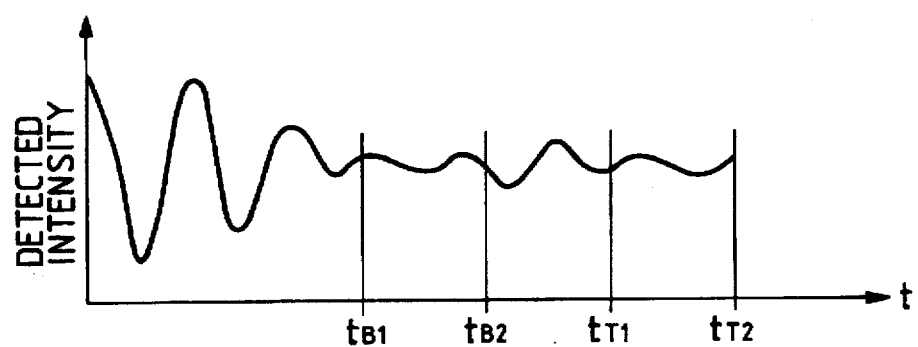
Figure 10C:
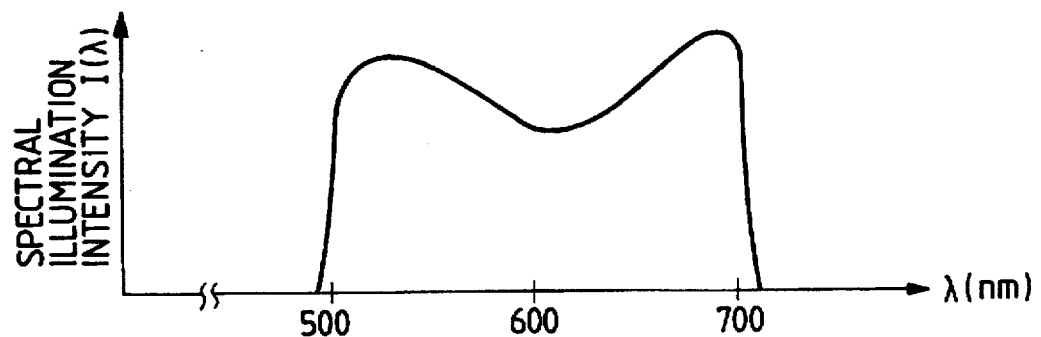
Figure 23A:
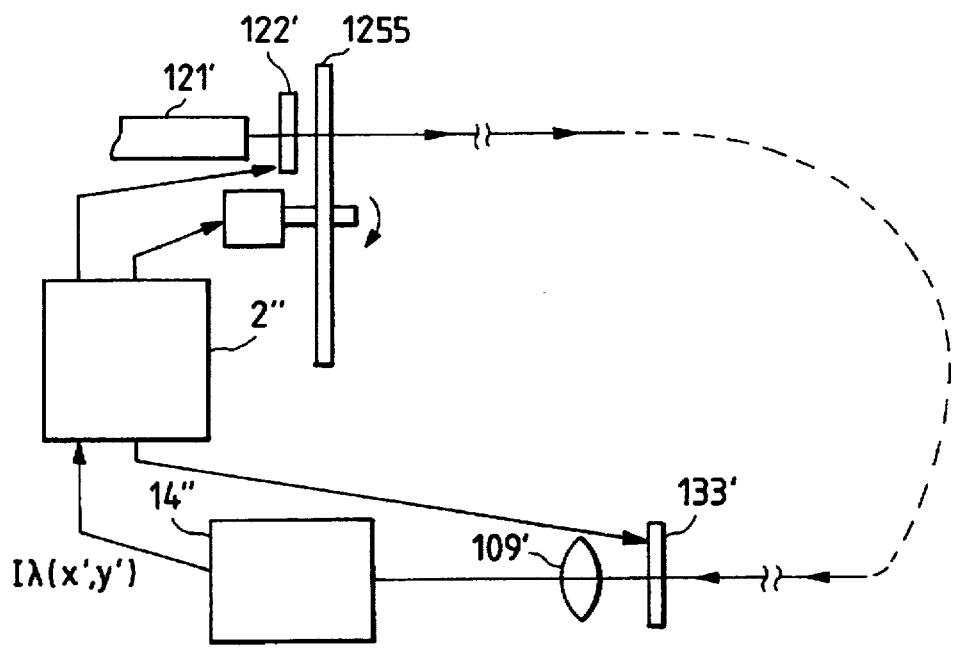
FIGS. 23A, 23B, 23C and 23D are block diagrams depicting a system for detecting two-dimensional patterns and directivity adjusting apparatus.
Figure 23B:
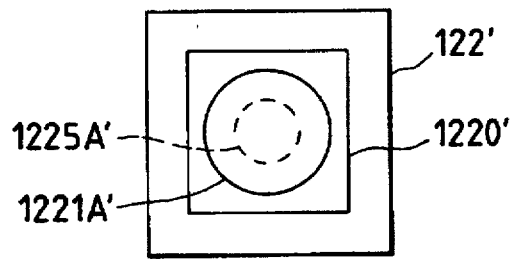
Figure 23C:
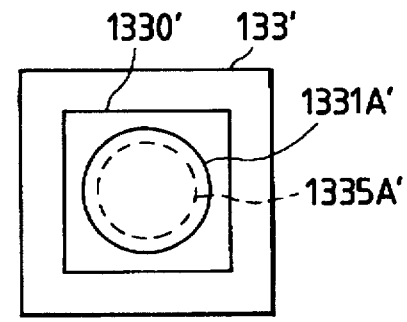
Figure 23D:
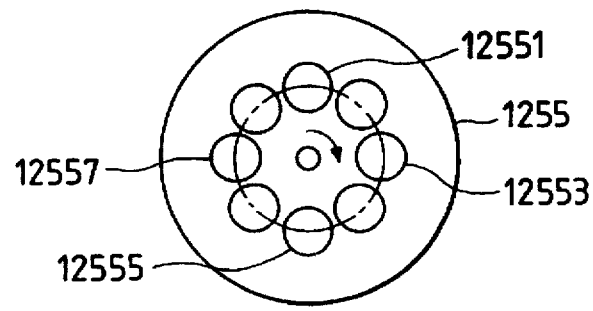

FIGS. 23A, 23B, 23C and 23D show a still further embodiment for detecting each of two-dimensional patterns. The illuminating light source (not shown) shown in FIG. 20A and 20B is used and a light-beam emission terminal of a fiber 121' is not separated or divided up as in the embodiment shown in FIGS. 10A–10C and emits illuminating light therefrom. The emitted light passes through a directivity adjusting apparatus 122' shown in FIG. 23B and is then transmitted through a wavelength selecting apparatus 1255. The directivity adjusting apparatus 122' set the directivity of the illuminating light to a desired value for each wavelength. Therefore, the inside of a desired region 1221A' (where the wavelength is λ) in a transmittance variable region 1220' such as a liquid crystal is set to a desired transmittance and the outside thereof is set to a transmittance of 0 as shown in FIG. 23B.

The wavelength selecting apparatus 1255 has bandpass filters 12551 through 12558 whose transmission wavelength bands are respectively different from each other little by little and each of which is arranged in the form of a disc along a circumferential direction. Light beams at wavelength bands λ1 through λ8 obtained by separating 400 nm through 700 nm into 8 equal parts can be obtained by rotating the discs. An object to be detected such as a wafer is irradiated with the illuminating light obtained in this way in a manner similar to the above embodiment. Thereafter, the resultant reflected light is introduced into a numerical-aperture adjusting and detecting apparatus 133' having the same function as that of the directivity adjusting apparatus 122'. The numerical-aperture adjusting and detecting apparatus 133' is situated in a position of conjugation with a pupil of an detection optical system. A desired detection numerical aperture NA can be obtained by setting the inside of an aperture 1331A' in a light-transmissive region 1330' to a light-transmissive state and setting the outside thereof to a light-intransmissive or -shielding state.

When a pattern detection has been finished under the wavelength band λ1 and information Iλ(x', y') about the result of detection is stored in a signal processing circuit 2", the disc of the wavelength selecting apparatus 1255 is rotated so that a pattern detection at the wavelength band λ2 can be achieved. Further, the directivity adjusting apparatus 122' and the numerical-aperture adjusting and detecting apparatus 133' are driven and set to conditions decided under the wavelength band λ2. Next, a signal detected under the wavelength band λ2 is stored in the signal processing circuit 2". The above operations are successively performed up to the wavelength band λ8 and signals detected under all the wavelength bands are stored in the signal processing circuit 2". A specific embodiment showing how to use the resultant signals will next be described below.

Figure 24:
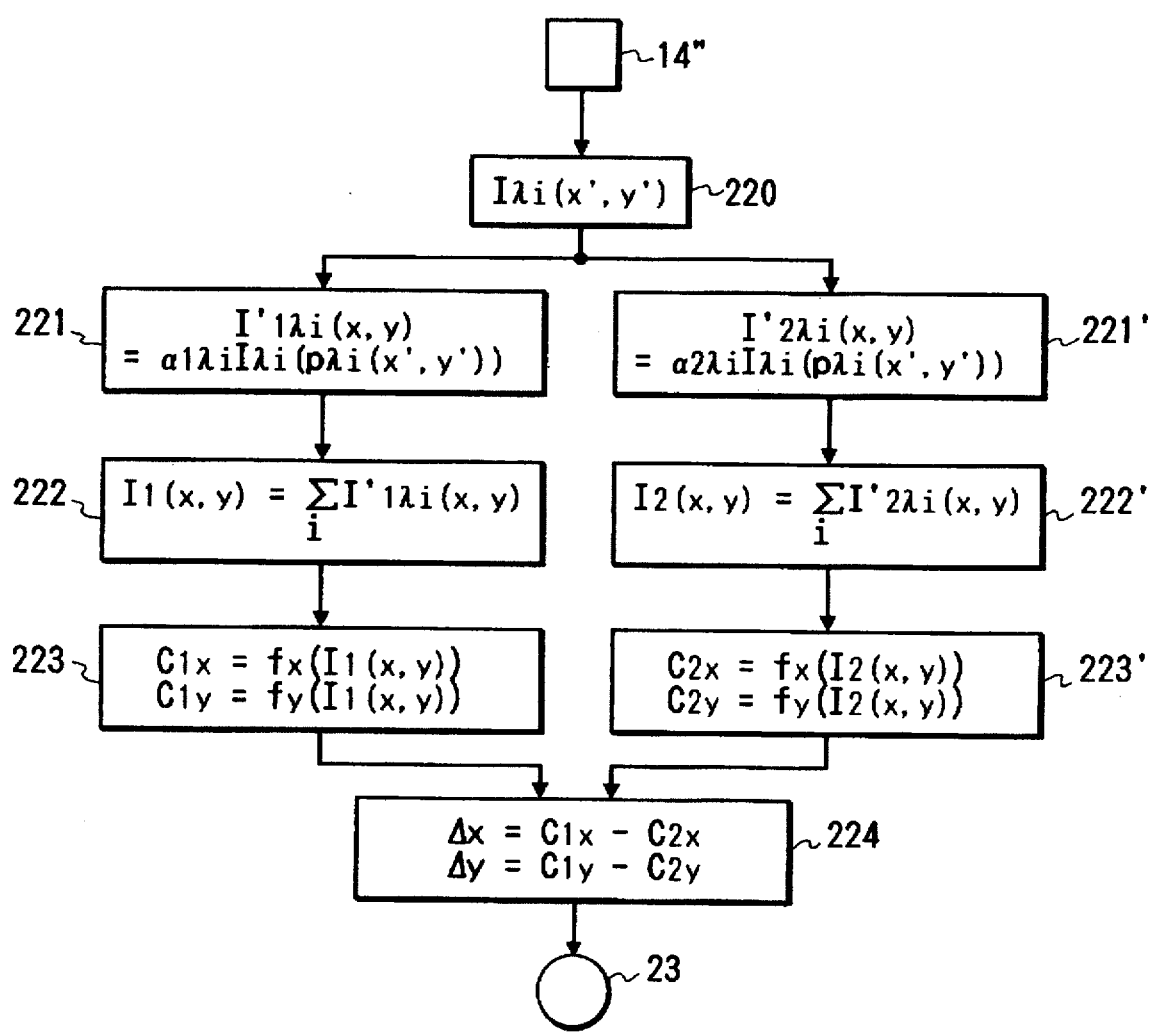
FIG. 24 is a view for describing a processing flow employed in the present invention, which is used when the two-dimensional patterns are detected.

A method of determining shifts or displacements αx and αy extending in x and y directions, of the pattern portions 411 and 412 of the two-dimensional pattern 41' shown in FIG. 5, for example, which has been obtained by each of the methods described using FIGS. 20 and 23, will now be described with reference to FIG. 24. FIG. 24 shows a flow of processing of detected signals and the contents of their processing. All the respective blocks may individually be realized by dedicated electronic circuits but the blocks short in processing time are electrically processed by a common microcomputer. A signal detected and obtained under a wavelength band A is defined as Iλ (x', y'). Since the patterns 411 and 412 are different in structure and material from each other as described above, the optimum spectral illuminance distributions to be detected are different from each other.

Since the waveforms to be detected can independently be obtained every wavelength bands in the embodiments shown in FIGS. 20, 22 and 23, the resultant signals are respectively multiplied by constants $\alpha 1\lambda$ and $\alpha 2\lambda$ every patterns 411 and 412 and every detected wavelength bands λ. Further, the aforementioned aberrations are corrected in Steps 221 and 221'. The resultant corrected waveforms are given by equations I1λ'(x, y) and I2λ'(x, y) in Steps 221 and 221' shown in FIG. 24. The corrected waveforms obtained under the respective wavelengths are processed in Steps 222 and 222'. That is, intensity waveforms are added together over all the wavelengths every position coordinates of the patterns 411 and 412 to thereby obtain ideal waveforms given by I1(x, y) and I2(x, y).

Using the resultant waveforms, e.g., an algorithm of matching symmetric patterns, the central positions C1 and C1, and C2 and C2 extending in the x and y directions, of the respective patterns 411 and 412 are determined in Steps 223 and 223'. Further, f and f in FIG. 24 respectively represent arithmetic functions (such as an arithmetic function for the matching of the symmetric patterns) for calculating or determining the centers of the patterns. Position displacements αx and αy extending in the x and y directions, of both patterns are determined in Step 224 based on the so-determined x- and y- direction centers of the patterns 411 and 412. A description will next be made of an example showing how to use information about the position displacements obtained in the above-described manner.

Figure 25:
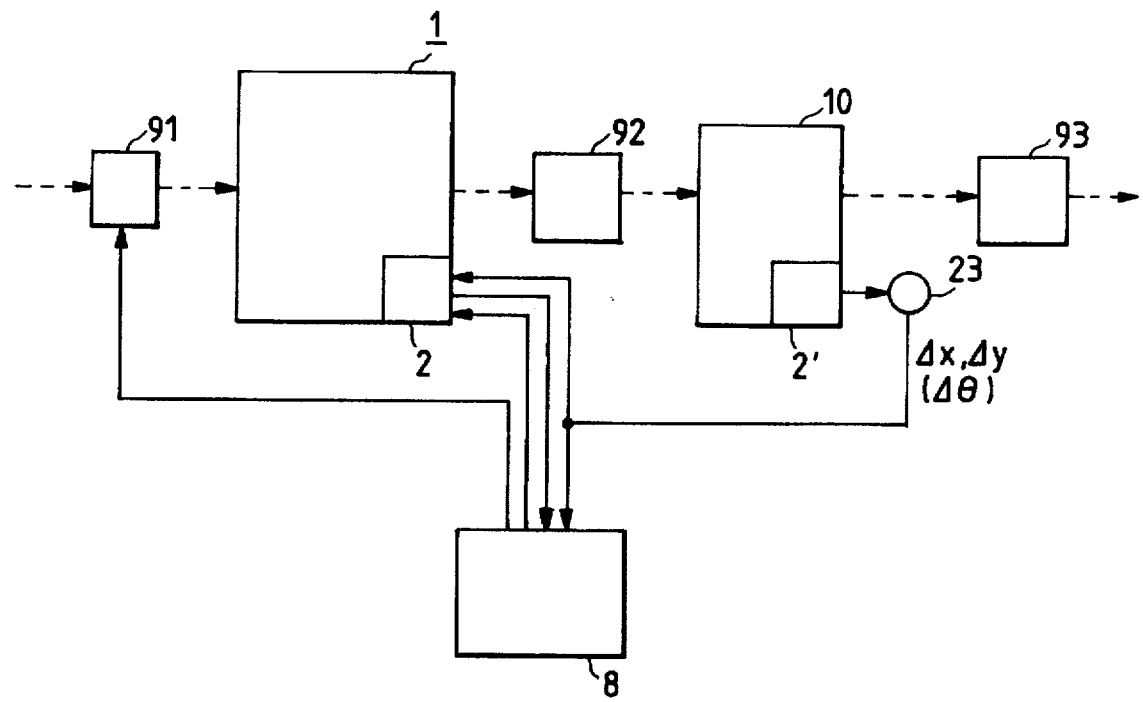

FIG. 25 illustrates an embodiment showing an exposing system according to the present invention. Reference numeral 1 indicates an exposure or exposing device, e.g., the reduction exposing device shown in FIG. 1. Reference numeral 2 indicates a control circuit for controlling the exposing device 1. Reference numeral 10 denotes, for example, either the pattern detecting device shown in FIG. 4 or an alignment evaluating device. Reference numeral 2' indicates a control circuit used for the alignment evaluating device 10. Reference numerals 91, 92 and 93 indicate a resist applying device, a developer unit and an etching device respectively. Reference numeral 8 indicates a control circuit for controlling these photolithographic systems. Each of flows indicated by the dot lines in the drawing shows the flow of a wafer, whereas each of flows indicated by the solid lines shows the flow of a signal.

A wafer on which a resist has been applied by the resist applying device 91 is delivered to the exposing device 1. Since an alignment pattern has been recorded on the delivered wafer for each exposure chip as shown in FIG. 2, the alignment pattern 41 (41') is detected by a detection system 10X (10Y) through the reduction lens 5. The wafer stage 7 is driven based on information about the position of the alignment pattern, information about the position of the laser length-measuring machine (not shown in FIG. 1) on the wafer stage and information about the position of the reticle 3 to thereby align the patterns with each other and thereafter effect an exposure process on the wafer.

Such an exposure process is effected over the entirety surface of the wafer in a step-and-repeat system. The circuit pattern painted or drawn on the reticle 3 is exposed to light so as to correspond to the entirety surface of the wafer. As the embodiment shown in FIG. 1 and applied to the optical system 10X has already been described above, the exposing device to which the pattern detecting method according to the present invention is applied can provide a proper alignment pattern detection and realize accurate superposition exposure. The exposed wafer is fed to the developer unit 92 where it is developed. In order to evaluate the superposition exposure in advance, the pattern 411 shown in FIG. 5, for example, is recorded on the developed wafer before exposure. Since a new resist pattern 412 has been exposed to light so as to be placed on the pattern 411, the position of the pattern 411 relative to the pattern 412 is detected by the alignment evaluating device as has been described in the aforementioned embodiment, with the result that the accuracy of the superposition exposure is evaluated. The result of evaluation is outputted from the control circuit 2' and sent to the control circuit 8 as an output 23.

The control circuit 8 is connected to the resist applying device 91 and the exposing device 1. If the result of evaluation of the superposition exposure does not fall within a target precision, then its cause is analyzed. When such a cause is developed in or from the resist applying device, resist applying conditions such as a rotational speed of a spin coater, acceleration and deceleration of rotation, resist-solvent vapor pressure or temperature of the applying device, etc. are controlled so as to reach the optimum. If an undesired cause produced as a result of superposition evaluation originates from the exposing device, it is then decided which part in the exposing device would produce a cause.

A malfunction checking function is originally provided within the exposing device and the result of detection of the alignment, the position information at exposure, etc. are always recorded in the exposing device. Further, the exposing device monitors states of respective devices at all times and records the same therein. Such information is sent to the control circuit 8, which decides, based on that information and the information sent from the alignment evaluating device 10, whether or not the alignment detection system of the exposing device 1 contributes to the cause. This decision can be mostly made by the control circuit 8. If the illuminating apparatus and the detecting apparatus described above are provided with the alignment detection system of the exposing device as in the present embodiment, it is then natural that the superposition exposure should have been realized with considerable accuracy. However, if there is a demand for the achievement of the superposition exposure with higher accuracy and the illuminating apparatus and the detecting apparatus are not included in the exposing device, it is then necessary to feed back the result of evaluation of the alignment used as the basis to the exposing device and obtain a higher alignment precision at subsequent exposure. As a method of feeding back the result of evaluation of the alignment to the exposing device, there are known two effective methods.

According to the first method, values of superposition errors αx, αy and αθ extending in x, y and θ(θ is given by the following equation, i.e., θ=(x1−x2)/r where x1 and x2 represent detected positions of two x-direction detection patterns located in two points spaced by r from the exposure chip) directions, which are obtained as a result of evaluation of the alignment, are given as offset values at next wafer exposure and then corrected on software basis. That is, assuming now that offset values obtained when the wafer is exposed to light are αxθ, αyθ and αθθ, for example, this feedback process is executed to set offset values αx1, αy1 and αθ1, used for the next exposure to αx1 =αx0−αx, αy1 =αy0 −αy, and αθ0−αθ, thereby effecting an exposure process on the wafer. In doing so, the superposition accuracy can be greatly improved after the feedback process has been completed.

According to the second method, the conditions such as the spectral illuminance distribution and the directivity of illumination of the aforementioned illumination system in the alignment system of the exposing device and the numerical aperture or the like to be detected for each wavelength, which is used for the detection optical system, are further changed to the optimum conditions. Thus, the superposition and exposure accuracy can be greatly improved by feeding back the result of evaluation of the alignment to either the exposing device or the resist applying device using either one of the methods.

Figure 26:
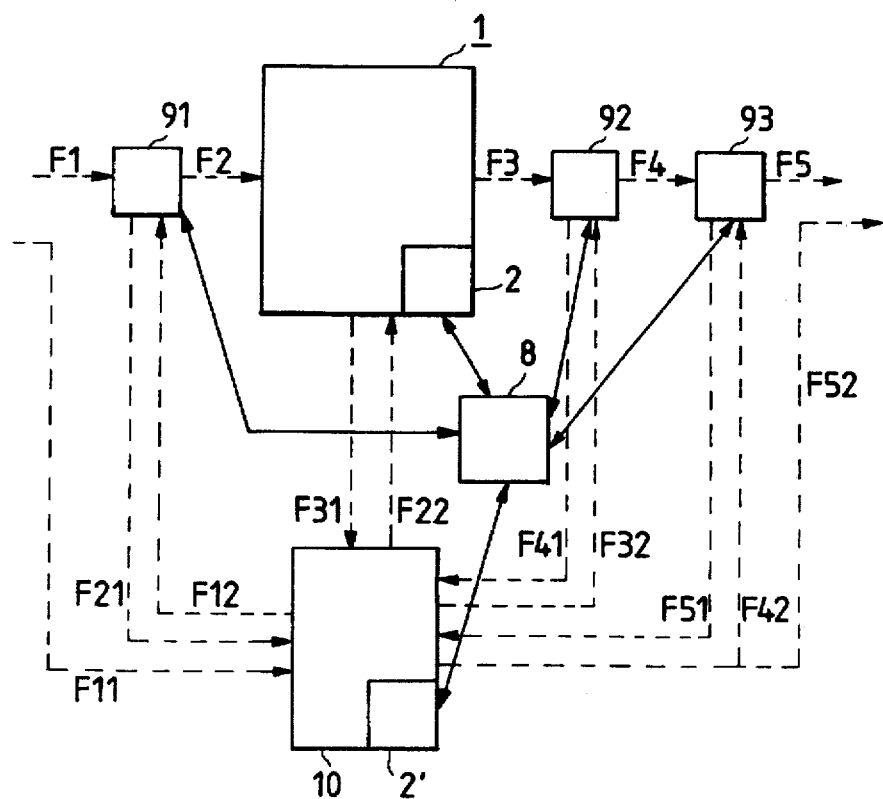
FIG. 26 is a block diagram showing another exposing system according to the present invention.

Another embodiment of an exposing system according to the present invention will next be described with reference to FIG. 26. The same reference numerals shown in FIG. 26 as those shown in FIG. 25 indicate components identical to those shown in FIG. 25. Each of arrows indicated by the dot lines in the drawing shows the flow of a wafer. Since, however, the arrows are placed in order substantially to all the cases, numerals, which begin with symbols F, are affixed to the respective flows to facilitate a subsequent description. Each of flows indicated by the solid lines show the flow of signal information. A plurality of embodiments (A) through (E) will hereinafter be described with reference to FIG. 26.

(Embodiment A)

Flow of wafer: $F11 \rightarrow F12 \rightarrow F21 \rightarrow F22 \rightarrow F3 \rightarrow F4 \rightarrow F5$ A wafer alignment pattern (having no resist applied thereon) formed in accordance with a previous exposure and development etching step is evaluated by the alignment evaluating device 10 so that the symmetry of the wafer pattern or the like is evaluated. Since its symmetry is normally satisfactory, the wafter pattern is evaluated again by the alignment evaluating device 10 in a state in which a subsequent resist has been applied thereon. If the alignment pattern is unsymmetrical as a result of detection of the alignment pattern, it can then be decided that the resist has been applied unsymmetrically.

That is, in order to make a detected waveform symmetric with respect to the unsymmetry of the applied resist as described above, the result of evaluation of the alignment is fed forward to the exposing device 1 by the apparatus 12 and 13 in the alignment detection system of the aforementioned exposing device 1 in such a manner that the alignment pattern is detected under the optimum conditions. In doing so, the alignment detection made prior to the exposure by the exposing device 1 is not affected by the nonuniformity of application of the resist to the pattern and the accurate superposition exposure can be achieved.

In this case, the alignment evaluating device does not need to evaluate the result of alignment after the exposure and development process have been completed. However, the evaluation about the result of the alignment F41 to (→) F42 may be performed as an alternative to F4 for confirmation. When the symmetry of the wafer pattern is poor as a result of evaluation by the alignment evaluating device 10 after F11 referred to above, the result of poor symmetry or unsymmetry is sent to the control device 8, where it is fed back to an etching device (not shown), or the unsymmetry is evaluated and offset values for alignment are decided and fed forward to the exposing device 1.

(Embodiment A')

Flow of wafer: $F11 \rightarrow F12 \rightarrow F21 \rightarrow F22 \rightarrow F3 \rightarrow F4 \rightarrow F5$ The flow of the wafer is identical to that in the embodiment A.

In the present embodiment, the apparatus according to the present invention are not included in the alignment detection system of the exposing device 1. Now, consider that monochromatic light obtained by a mercury lamp or a laser beam is detected as an illuminating light source. So long as the present embodiment is used even in this case, the exposure can be carried out with higher alignment accuracy.

A method of realizing this embodiment will be described below.

First of all, conditions applied to the detection system of the alignment evaluating device 10 are set to the same conditions as those for the alignment detection system of the exposing device. Since, in this case, the spectral illumination, the directivity of the illumination and the numerical aperture to be detected can be controlled by the alignment evaluating device 10, the conditions for the detection system can be easily set to the same conditions as those for the alignment detection system of the exposing device. Under such a state (that the conditions for the detection system of the alignment evaluating device 10 are identical to those for the alignment detection system of the exposing device), the position of each alignment pattern on a wafer is detected.

While the result of detection is represented as (x1, y1), for example and the position of the wafter then remains unchanged, the optical system of the alignment evaluating device is varied or displaced so that the optimum condition for the above detection can be obtained, thereby detecting the position of each alignment patter on the wafer. The result of detection is represented as (x0, y0).

Further, offset values $\alpha x = x0-x1$ and $\alpha y = y0-y1$ are determined using these results referred to above. Next, these values are added to the result of detection of the alignment obtained upon next exposure, thereby making it possible to effect the superposition exposure with higher accuracy. A flow after the exposure has been finished, is identical to that employed in the embodiment A.

(Embodiment B)

Flow of wafer: $F1 \rightarrow F21 \rightarrow F12 \rightarrow F21 \rightarrow F22 \rightarrow F3 \rightarrow F4 \rightarrow F5$ When the symmetry of a pattern formed on a wafer is maintained in a stable state, it is unnecessary to evaluate an alignment pattern before a resist is applied thereto. In this case, the alignment pattern after the resist has been applied thereto is evaluated by an alignment evaluating device. Illumination and detection conditions for an alignment detection system of an exposing device are optimized as described above. The subsequent flow is identical to the flow employed in the embodiment A.

(Embodiment B')

Flow of wafer: $F1 \rightarrow F21 \rightarrow F12 \rightarrow F21 \rightarrow F22 \rightarrow F3 \rightarrow F4 \rightarrow F5$ The flow of the wafer is identical to that employed in the embodiment B.

In the present embodiment, the above apparatus according to the present invention are not applied to an alignment detection system of an exposing device 1 in a manner similar to the embodiment A'. Monochromatic light obtained by a mercury lamp or a laser beam, for example, is detected as an illuminating light source. Similarly to the embodiment A', offset values used for the detection of alignment by the exposing device are determined by the alignment evaluating device 10 based on the result detected by alignment evaluating device 10 under the same detection conditions as those for the alignment detection system of the exposing device and the result detected under the optimum condition to thereby effect the superposition exposure based on the determined offset values.

(Embodiment C)

Flow of wafer: $F1 \rightarrow F2 \rightarrow F3 \rightarrow F41 \rightarrow F32 \rightarrow F4 \rightarrow F5$ The present embodiment is identical to that shown in FIG. 25 and its description will therefore be omitted.

(Embodiment D)

Flow of wafer: $F1 \rightarrow F2 \rightarrow F3 \rightarrow F41 \rightarrow F42 \rightarrow F51 \rightarrow F52$ The wafer is developed after have been exposed to light. Next, the accuracy of alignment of the pattern 411 formed before exposure to light with the resist pattern 412 formed by exposure as shown in FIG. 5 is evaluated by the alignment evaluating device 10. After its accuracy has been evaluated, etching is performed. Further, the accuracy of alignment of the etching pattern formed by the resist mask of the resist pattern 412 with the pattern 411 is evaluated. If the results obtained by carrying out the evaluation two times coincides with each other, then a problem does not arise. If they are inconsistent with each other, on the contrary, then the amount of inconsistency is added to the result of detection of the alignment as an offset value for alignment upon exposure of the wafer to light, thereby making it possible to correct an alignment offset produced with the execution of the etching. Thus, the superposition exposure of the patterns on the next wafer to light can be achieved with high accuracy.

(Embodiment E)

Flow of wafer: $F1 \rightarrow F2 \rightarrow F31 \rightarrow F32 \rightarrow F41 \rightarrow F42 \rightarrow F5$ The wafer prior to development is evaluated by an alignment evaluating device after its exposure. This evaluation apparatus that the accuracy of alignment of a latent image formed on a resist pattern after the exposure of the wafer to light with the already formed underpattern is evaluated. Since the amount of displacement obtained from that evaluation is obtained before the development of the wafter, this result can be immediately utilized as alignment offset values employed upon exposure of the next wafer to light. Therefore, the pattern superposition exposure can be realized with high accuracy without a reduction in a throughput.

According to the present invention, the alignment of patterns with each other at the time of exposure of a semiconductor circuit to light can be executed with high accuracy regardless of the nonuniformity of application of a resist on a wafer and without depending on a structure of a film of an underpattern. Further, circuits mounted at a high density can be fabricated in higher yield. Moreover, the measurement of dimensions and intervals or the like of a formed pattern, which is performed upon production of the semiconductor circuit, can be carried out with high accuracy, thereby making it possible to achieve an improvement in production yield.

While the present invention has been described in detail and pictorially in the accompanying drawings it is not limited to such details since many changes and modifications recognizable to those of ordinary skill in the art may be made to the invention without departing from the spirit and the scope thereof.

What is claimed is:

1. A method of detecting a pattern image of each of a plurality of patterns on the surface of an object, comprising the steps of:

applying light emitted from either a light source including a wide wavelength or a light source including a plurality of monowavelengths to said object, said object having a layered structure which includes a plurality of layers, wherein at least a part of the uppermost layer of said object is optically transparent;

effectively varying spectral illumination intensity characteristics of the light emitted from said light source depending on information about both the layered structure of said object and a material of said object to obtain a desired spectral illumination intensity; and detecting a pattern image of each of said patterns as either a one-dimensional or a two-dimensional image based on light reflected from said object.

2. A method as claimed in claim 1, wherein the light emitted from said light source is set such that a traveling direction of the light is varied for each wavelength by a light separator and said spectral illumination intensity characteristics are thereafter effectively varied by inserting, into optical paths separated by said light separator, a spatial light transmittance modulator for making light transmittances different from each other at each location where the light of each wavelength passes therethrough.

3. A method as claimed in claim 1, wherein when, the pattern image of said object irradiated with the light at said desired spectral illumination intensity is detected as either the one-dimensional or the two-dimensional image, a spectral transmittance variable filter for varying a transmittance for each wavelength of the light reflected from said object is inserted into an optical path of each light reflected from said object to thereby effectively vary the spectral illumination intensity characteristics of the light emitted from said light source.

4. A method as claimed in claim 1, wherein when, the pattern image of said object irradiated with the light at said desired spectral illumination intensity is detected as either the one-dimensional or the two-dimensional image, numerical apertures used for detection of the pattern image are made different from each other every wavelength of the light reflected from said object.

5. A method as claimed in claim 4, wherein each wavelength of the light emitted from the light source is caused to have directivity so as to reach a partial coherence of illumination having a predetermined ratio with respect to each of said numerical apertures.

6. A method as claimed in claim 1, wherein a multiple interference intensity at each wavelength of the detected image pattern, which is caused by the layer structure, is calculated based on the information about both the layered structure of said object and the material of said object and the spectral illumination intensity characteristics of the light emitted from said light source are effectively varied depending on said information so as to produce a waveform of a detected signal capable of reflecting the structure of each pattern with fidelity.

7. A method of detecting a pattern image of each of a plurality of patterns on a surface of an object, comprising the steps of:

applying light emitted from either a light source including a wide wavelength or a light source including a plurality of monowavelengths to said object, said object having a layered structure which includes a plurality of patterns, wherein at least a part of an uppermost layer of said object is optically transparent;

substantially focusing the light emitted from said light source and reflected from said object on a light separator so as to spectrally separate the light in a predetermined spectral direction;

focusing light reflected from said object through said light separator on a detector so as to form an image in a pattern detecting direction orthogonal to said predetermined spectral direction in which the patterns separated by said light separator are spectrally separated; and detecting, by said detector, the spectrally separated patterns as spectral one-dimensional images.

8. A method as claimed in claim 7, wherein a correction about a chromatic aberration included in a detection optical system is effected on respective signals in a pattern detecting direction, which correspond to respective spectral wavelengths of spectral one-dimensional images and respective signals subjected to the chromatic aberration correction are thereafter synthesized to produce a synthesized signal, thereby detecting each pattern image based on a synthesized signal.

9. A method as claimed in claim 7, wherein respective signals existing in the pattern detecting direction are multiplied by constants different from each other every wavelength over the entirety of the signals having their corresponding wavelengths and the wavelengths of the signals are thereafter combined into one, thereby detecting each pattern based on the combined wavelength.

10. A method as claimed in claim 7, wherein respective signals are multiplied every wavelength by constants different from each other depending on locations of the signals having their corresponding wavelengths and respective wavelengths of the signals are combined into one, thereby detecting each pattern based on the combined wavelength.

11. A device for detecting a pattern image of each of a plurality of patterns on the surface of an object, comprising:

a light source for emitting one of a light including a wide wavelength and a light effectively including a plurality of monowavelengths;

an illuminating device for irradiating said object using light emitted from said light source, said object having a layered structure which includes a plurality of layers, wherein at least a part of the uppermost layer of said object is optically transparent to light emitted from said light source;

a pattern detector for detecting each pattern on the surface of said object using the light reflected from said object;

apparatus for varying spectral illumination intensity characteristics of the light emitted from said light source depending on information about both the layered structure of said object and a material of said object to thereby obtain a desired spectral illumination intensity; and an image-forming optical system for detecting a pattern image of said object irradiated with the light at said desired illumination intensity as either a one-dimensional or a two-dimensional image.

12. A device as claimed in claim 11, wherein said varying apparatus comprises:

a light separator, disposed in the optical path of the light emitted from said light source, for varying the direction of traveling of the light for each wavelength; and a spatial light transmittance modulator, disposed in each optical path of the light separated by said light separator, for making light transmittances different from each other at each location where the light of each wavelength passes therethrough.

13. A device as claimed in claim 11, wherein said varying apparatus comprises:

a spectral transmittance variable filter, disposed in an optical path of the light reflected from the object irradiated with the light at said desired spectral illumination intensity, for varying a transmittance for each wavelength of the reflected light.

14. A device as claimed in claim 11, wherein said image-forming optical system includes apparatus for varying a numerical aperture thereof according to each wavelength of the light reflected from the object.

15. A device as claimed in claim 11, further comprising:
apparatus for causing each wavelength of the light to have directivity so as to reach a partial coherence of illumination having a predetermined ratio with respect to each numerical aperture for pattern detection made for each wavelength.

16. A device as claimed in claim 11, further comprising:
means for inputting information about both said layered structure of said object and said material of said object;
means for calculating a multiple interference intensity at each wavelength of the detected light, which is caused by the layered structure, based on the information about both the layered structure of said object and the material of said object; and
means for calculating the spectral illumination intensity characteristics of the light emitted from said light source, which are capable of obtaining a waveform of each detected signal reflecting the structure of each pattern with fidelity.

17. A device for detecting a pattern image of each of a plurality of patterns on the surface of an object, comprising:
a light source for emitting one of a light including a wide wavelength and a light effectively including a plurality of monowavelengths;
an illuminating device for irradiating said object with light emitted from said light source;
a pattern detector for detecting each pattern on the surface of said object using light reflected from said object;
an optical system for focusing light reflected from said object on a light separator;
said light separator, which includes a diffraction grating and is disposed in a position between said object and said optical system, separates light reflected from said object;
a non-rotation symmetry image-focusing system for focusing each of said patterns formed by light reflected from said object through said light separator with respect to a pattern detecting direction orthogonal to each of directions in which the patterns separated by said light separator are spectrally separated and for setting each pattern to a state in which said object subjected to the spectral process has been non-imaged, with respect to the light separating direction;
a two-dimensional image sensor for detecting spectral one-dimensional images based on patterns focused by said non-rotation symmetry image-focusing system; and
a processing circuit for electrically processing the images obtained by said two-dimensional image sensing device.

18. A device as claimed in claim 17, wherein said processing circuit effects a correction about a chromatic aberration included in respective signals existing in the pattern detecting direction, said respective signals corresponding to respective spectral wavelengths of the one-dimensional images, combines the respective signals subjected to the chromatic aberration correction into one and detects each pattern based on the combined signal.

19. A device as claimed in claim 17, wherein said processing circuit multiplies respective signals existing in the pattern detecting direction by constants different from each other every wavelength over all of the signals, said respective signals corresponding to wavelengths of the one-dimensional images, combines the wavelengths of the signals into one and detects each pattern based on the combined wavelength.

20. A device as claimed in claim 17, wherein said processing circuit multiplies respective signals every wavelength by constants different from each other depending on locations of the signals, said respective signal corresponding to wavelengths of the one-dimensional images, combines the respective wavelengths of the signals into one and detects each pattern based on the combined wavelength.

21. A projection exposing device comprising:
a mask for an original image;
an exposure illumination system for applying illumination to a pattern drawn on said mask;
a projection optical system illuminated by said exposure illumination system and for projecting light transmitted through said mask onto an object to be exposed and exposing the object to said light;
a movable stage having the object mounted thereon;
a pattern detecting unit for detecting a position of a pattern on the object;
alignment apparatus for aligning said mask relative to the object depending on the detected position of said pattern on said object;
a light source for emitting a light including a wide wavelength or effectively including a plurality of monowavelengths;
illuminating apparatus for irradiating an alignment pattern on said object with the light emitted from said light source, said object is comprised of a layered structure having a plurality of layers, wherein an uppermost layer of said object has at least an optically-transparent part;
pattern detecting apparatus for detecting the alignment pattern on the surface of said object using light reflected from said alignment pattern;
means for effectively varying spectral illumination intensity characteristics of the light emitted from said light source depending on information about both the layered structure of said object and a material of said object to thereby obtain a desired spectral illumination intensity; and
an image-forming optical system, disposed in an optical path of the light, for detecting a pattern image of said object irradiated with the light at said desired illumination intensity as either a one-dimensional or a two-dimensional image.

22. A projection exposing device as claimed in claim 21, wherein said varying apparatus comprises:
light separating means, disposed in an optical path of the light emitted from said light source, for varying the direction of travel of the light for each wavelength; and
a spatial light transmittance modulator, disposed in each optical path of the light separated by said light separating means, for making light transmittances different from each other at each location where the light having each wavelength passes therethrough.

23. A projection exposing device as claimed in claim 21, wherein said varying apparatus comprises:
a spectral transmittance variable filter, disposed in an optical path of the light reflected from the object irradiated with the light at said desired spectral illumination intensity, for varying a transmittance for each wavelength of the reflected light.

24. A projection exposing device as claimed in claim 21, wherein said image-forming optical system comprises:

means for varying a numerical aperture thereof according to each wavelength of the light reflected from the object.

25. A projection exposing device as claimed in claim 21, further comprising:

means for causing each wavelength of the illuminating light to have directivity so as to reach a partial coherence of illumination having a predetermined ratio with respect to each numerical aperture for pattern detection made for each wavelength.

26. A projection exposing device as claimed in claim 21, further comprising:

means for inputting information about the layered structure of said object and the material of the object;

means for calculating a multiple interference intensity at each wavelength of detected light, caused by the layered structure of said object, based on the information about both the layered structure of said object and the material of the object; and means for calculating the spectral illumination intensity characteristics of the light emitted from said light source, which are capable of obtaining a waveform of each detected signal reflecting the structure of each pattern with fidelity.

27. A projection exposing device as claimed in claim 21, wherein said pattern detecting unit comprises:

said illuminating apparatus constructed in such a manner that the light emitted from said light source is transmitted through said projection optical system and applied to said object; and said pattern detecting means for detecting the alignment pattern on the object.

28. A projection exposing device as claimed in claim 21, wherein said pattern detecting means comprises:

means apparatus for correcting a chromatic aberration developed when the light emitted from the light source and reflected from the alignment pattern passes through said projection optical system.

29. A projection exposing device as claimed in claim 28, wherein said pattern detecting means is provided in a pair each constructed so as to detect each of two alignment patterns disposed on the surface of said object and orthogonal to each other and to detect a sagittal image of said projection optical system and said chromatic aberration correcting apparatus effects a color correction on said sagittal image.

30. A projection exposing device as claimed in claim 29, wherein a main ray of detected light of the light reflected from one of the two alignment patterns falls within a plane including the direction of the alignment pattern and a normal line to the object and serves to vary the angle of reflection for each wavelength.

31. An exposing system comprising:

a projection exposing device which includes:

an exposure illumination system for applying illumination to a pattern drawn on an original-image mask;

a projection optical system illuminated by said exposure illumination system and for projecting light transmitted through said mask onto an object to be exposed and exposing the object to said light, a movable stage having the object mounted thereon, a pattern detection system for detecting a position of a pattern on the object, and alignment apparatus for aligning said mask relative to the object depending on the position of said pattern on the object;

a pattern detecting unit for setting an object, before and after being exposed to the light by said projection exposing device, as said object, irradiating said object with the light emitted from either a light source including a wide wavelength or a light source effectively including a plurality of monowavelengths and detecting a pattern on the surface of said object using the light reflected from said object;

a device for forming a light-sensitive layer on said object to be exposed;

a unit for developing the light-sensitive layer exposed to the light by said projection exposing device;

a device for etching said developed light-sensitive layer on said object; and a control device for feeding back pattern position information about alignment, which has been detected by said pattern detecting unit, to said light-sensitive layer forming device or said developing unit or said etching device, or feeding back or feeding forward pattern position information to said projection exposing device.

32. An exposing system as claimed in claim 31, wherein when the position of the pattern such as an alignment pattern on the object is detected by said pattern detecting unit before said projection exposing device effects an exposure process on the object, optical conditions of said pattern detecting unit are varied to thereby detect the alignment pattern at an illumination of the pattern detection system to obtain first pattern position information and second pattern position information, and a difference between the first pattern position information and the second pattern position information is determined and fed forward to said projection exposing device as an alignment offset value when said projection exposing device effects the exposure process on the object.

33. An exposing system as claimed in claim 31, wherein the light-sensitive layer on said object exposed to light by said exposing device is developed by said developing unit, the position of the alignment pattern on the object is detected by said pattern detecting unit to thereby determine an error in position at superposition exposure, and the error is fed back to a next exposure as an alignment offset for an object to be next exposed.

* * * * *